(12) United States Patent
Wu et al.

(10) Patent No.: US 12,315,720 B2
(45) Date of Patent: *May 27, 2025

(54) METHOD FOR IMPROVING SURFACE OF SEMICONDUCTOR DEVICE

(71) Applicant: Taiwan Semiconductor Manufacturing Co., Ltd., Hsinchu (TW)

(72) Inventors: Jung-Tang Wu, Kaohsiung (TW); Yu-Jen Chien, Hsinchu (TW); Szu-Hua Wu, Zhubei (TW); Chin-Szu Lee, Taoyuan (TW); Yao-Shien Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 5 days.

This patent is subject to a terminal disclaimer.

(21) Appl. No.: 18/360,259

(22) Filed: Jul. 27, 2023

(65) Prior Publication Data

US 2023/0369044 A1    Nov. 16, 2023

Related U.S. Application Data

(63) Continuation of application No. 17/339,785, filed on Jun. 4, 2021, now Pat. No. 11,749,524, which is a
(Continued)

(51) Int. Cl.
*H01L 21/02*        (2006.01)
*H01L 21/04*        (2006.01)
(Continued)

(52) U.S. Cl.
CPC ........ *H01L 21/0234* (2013.01); *H01L 21/044* (2013.01); *H01L 21/28088* (2013.01);
(Continued)

(58) Field of Classification Search
CPC ............... H01L 21/0234; H01L 21/044; H01L 21/28088; H01L 21/321; H10B 61/00;
(Continued)

(56) References Cited

U.S. PATENT DOCUMENTS 6,090,709 A      7/2000  Kaloyeros et al.
6,465,348 B1    10/2002  Wang
(Continued)

OTHER PUBLICATIONS

Liu, H., et al., "Residual stress analysisof TiN film fabricated by plasma immersion ion implantation and deposition process," Nuclear Instruments and Methods in Physics Research B 297, Dec. 28, 2012, 6 pages.

*Primary Examiner* — Karen Kusumakar
*Assistant Examiner* — Adam S Bowen
(74) *Attorney, Agent, or Firm* — Slater Matsil, LLP

(57) ABSTRACT

A method of forming a semiconductor structure includes forming a first top electrode (TE) layer over a magnetic tunnel junction (MTJ) layer and performing a smoothing treatment on the first TE layer. The smoothing treatment is performed in situ after the forming first TE layer. The smoothing treatment removes spike point defects from the first TE layer. Additional TE layers may be formed over the first TE layer.

20 Claims, 29 Drawing Sheets

Related U.S. Application Data continuation of application No. 16/589,392, filed on Oct. 1, 2019, now Pat. No. 11,031,236.

(51) Int. Cl.
*H01L 21/28* (2006.01)
*H10B 61/00* (2023.01)
*H10N 50/01* (2023.01)
*H10N 50/85* (2023.01)

(52) U.S. Cl.
CPC .............. *H10B 61/00* (2023.02); *H10N 50/01* (2023.02); *H10N 50/85* (2023.02)

(58) Field of Classification Search
CPC ........ H10B 61/22; H10N 50/01; H10N 50/85; H10N 50/10; H10N 50/80
See application file for complete search history.

(56) References Cited

U.S. PATENT DOCUMENTS

| | | |
|---|---|---|
| 6,486,530 B1 | 11/2002 | Sasagawa et al. |
| 9,399,812 B2 | 7/2016 | Bodke et al. |
| 2006/0030151 A1 | 2/2006 | Ding et al. |
| 2007/0284334 A1 | 12/2007 | Todorov et al. |
| 2009/0242385 A1 | 10/2009 | Robison et al. |
| 2012/0043617 A1 | 2/2012 | Nakagawa et al. |
| 2016/0079057 A1 | 3/2016 | Varadarajan et al. |
| 2016/0276580 A1 | 9/2016 | Tahmasebi et al. |
| 2018/0097173 A1* | 4/2018 | Chuang ................ H10N 70/826 |
| 2018/0248112 A1* | 8/2018 | Chuang ................ H10N 50/10 |

\* cited by examiner

METHOD FOR IMPROVING SURFACE OF SEMICONDUCTOR DEVICE

PRIORITY CLAIM AND CROSS-REFERENCE

This application is a continuation of U.S. application Ser. No. 17/339,785, filed on Jun. 4, 2021, entitled "Method for Improving Surface of Semiconductor Device," now U.S. Pat. No. 11,749,524, issued Sep. 5, 2023, which is a continuation of U.S. application Ser. No. 16/589,392, filed on Oct. 1, 2019, entitled "Method for Improving Surface of Semiconductor Device," now U.S. Pat. No. 11,031,236 issued Jun. 8, 2021, each application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to increase the density of electronic components (e.g., transistors, diodes, resistors, capacitors, etc.) in integrated circuits (ICs) by innovations in semiconductor technology such as, progressive reductions in minimum feature size, three-dimensional (3D) transistor structures (e.g., the fin field-effect transistor (FinFET)), increasing the number of interconnect levels, and non-semiconductor memory, such as ferroelectric random access memory (RAM) or FRAM, and magneto-resistive RAM or MRAM, within the interconnect levels stacked above the semiconductor substrate. The basic storage element of an MRAM is the magnetic-tunnel-junction (MTJ). A high component density enables the System-on-Chip (SoC) concept wherein multiple functional blocks, such as, central processing unit (CPU), cache memory (e.g., static RAM (SRAM)), analog/RF functions, and nonvolatile memory (e.g., Flash, FRAM, and MRAM) are integrated on a single integrated circuit, often referred to as a chip. Integrating such a diversity of functions on one chip often presents new challenges in forming and integrating a concomitantly large variety of electronic components and transistor structures.

Physical Vapor Deposition (PVD) and Chemical Vapor Deposition (CVD) are widely used for deposition processes of the layers used in the formation of integrated circuits. In a PVD process or a CVD process, a wafer is typically placed in a vacuum chamber, and placed on an electrostatic chuck. When a PVD process is performed, a target is further placed over the wafer. Process gases are introduced into the vacuum chamber. The PVD process or the CVD process may be accompanied by the generation of plasma.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 8A illustrate cross-sectional views of an MRAM cell using an MTJ storage element at various earlier stages of fabrication, in accordance with some embodiments.

DETAILED DESCRIPTION

Figure 1:
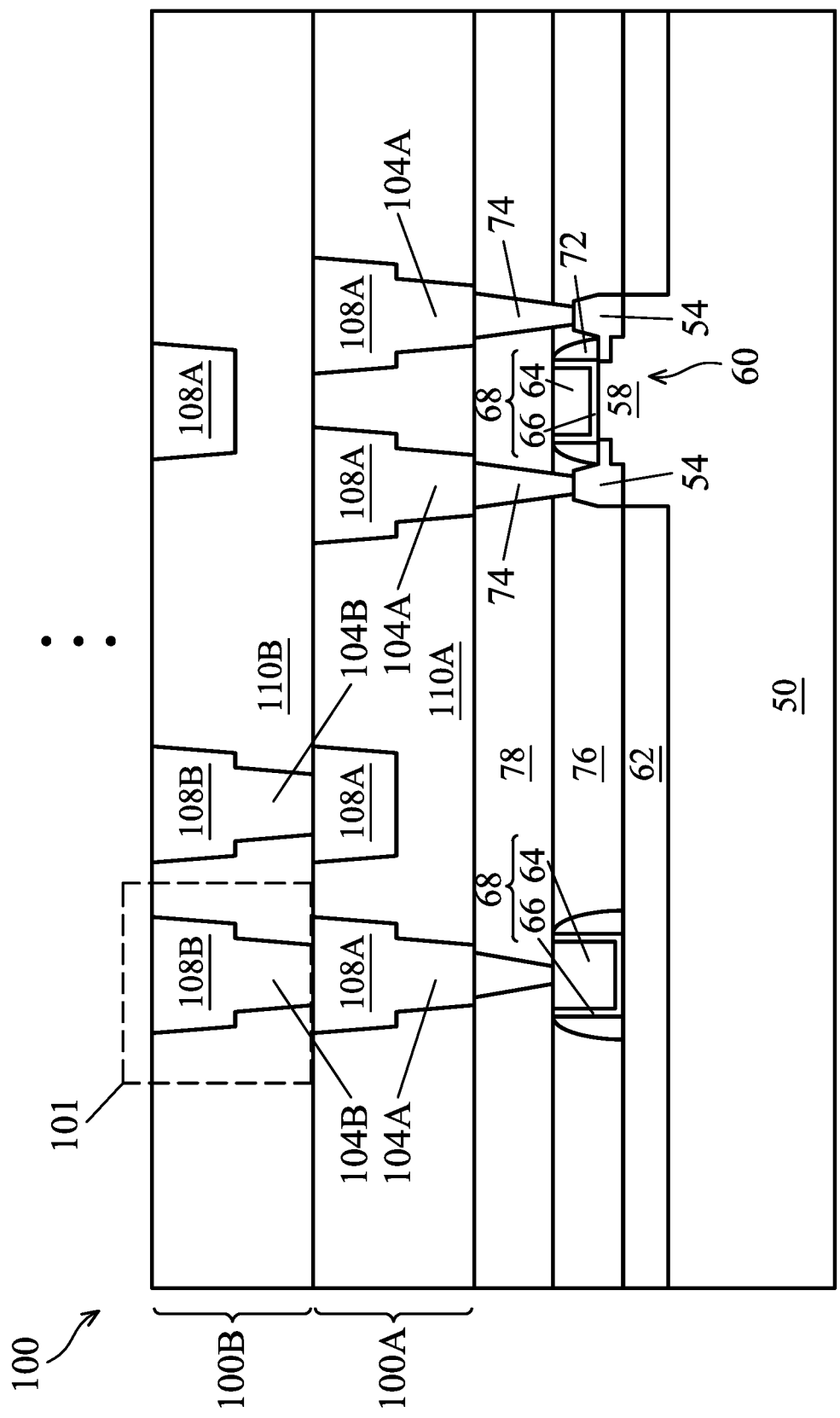
FIG. 1 illustrates a cross-sectional view of a semiconductor substrate and multilevel interconnect structures of an integrated circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure includes methods of forming, for example, a top electrode (TE) of MTJ memory cells of an MRAM array. The TE refers to a conductive element used to electrically contact a topmost layer of an MTJ which may be a storage element of a cell in an MRAM array. Formation of high thickness TE films, such as e.g. TiN films, for TE fabrication performed at high temperature with a long plasma deposition time can cause high grain size in the films. This high grain size may induce the formation of sharp points, or spike point defects, on the TE film. High roughness of the TE film and spike point defects can impede device performance. Advantageous features of the present disclosure's embodiments include reducing spike point defects and increasing device performance through different recipes including plasma treatments and soaking treatments to eliminate sharp points in the TE film and deposition of the TE film in multiple steps using low bias and high bias power. While the present disclosure discusses aspects of methods of forming a conductive element in the context of forming a top electrode of an MTJ memory cell, other embodiments may utilize aspects of this disclosure with other semiconductor fabrication processes.

FIG. 1 illustrates a cross-sectional view of a semiconductor structure 100 comprising a semiconductor substrate 50 in which various electronic devices may be formed, and a portion of a multilevel interconnect system (e.g., layers 100A and 100B) formed over the substrate 50, in accordance with some embodiments. Generally, as will be discussed in greater detail below, FIG. 1 illustrates a FinFET device 60 formed on a substrate 50, with multiple interconnection layers formed thereover. As indicated by the ellipsis at the top of FIG. 1, multiple interconnect levels may be similarly stacked in the fabrication process of an integrated circuit.

Generally, the substrate 50 illustrated in FIG. 1 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The FinFET device 60 illustrated in FIG. 1 is a three-dimensional MOSFET structure formed in fin-like strips of semiconductor protrusions 58 referred to as fins. The cross-section shown in FIG. 1 is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 1 illustrates a single fin 58, although the substrate 50 may comprise any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1 is a high-k, metal gate (HKMG) gate structure that may be formed using a gate-last process flow. In a gate last process flow a sacrificial dummy gate structure (not shown) is formed after forming the STI regions 62. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 62. As described in greater detail below, the dummy gate structure may be replaced by the HKMG gate structure 68 as illustrated in FIG. 1. The HKMG gate structure 68 illustrated in the right side in FIG. 1 (seen on the top of fin 58) is an example of an active HKMG gate structure which extends, e.g., along sidewalls of and over a portion of fin 58 protruding above the STI 62, and the HKMG gate structure 68 in the left side in FIG. 1 is an example gate structure extending over the STI region 62, such as between adjacent fins. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 60, illustrated in FIG. 1, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin (as illustrated in the right side of FIG. 1) or the surface of the STI dielectric (as illustrated in the left side of FIG. 1).

Source and drain regions 54 are semiconductor regions in direct contact with the semiconductor fin 58. In some embodiments, the source and drain regions 54 may comprise heavily-doped regions and relatively lightly-doped drain extensions, or LDD regions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily-doped source and drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of dopants may be introduced into the heavily-doped source and drain regions 54 either in situ during SEG, or by an ion implantation process performed after the SEG, or by a combination thereof.

A first interlayer dielectric (ILD) 76 (seen in FIG. 1) is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD 76. The HKMG gate structures 68, illustrated in FIG. 1, may then be formed by first removing the dummy gate structures using one or more etching techniques, thereby creating recesses between respective spacers 72. Next, a replacement gate dielectric layer 66 comprising one more dielectrics, followed by a replacement conductive gate layer 64 comprising one or more conductive materials, are deposited to completely fill the recesses. Excess portions of the gate structure layers 64 and 66 may be removed from over the top surface of first ILD 76 using, for example a CMP process. The resulting structure, as illustrated in FIG. 1, may be a substantially coplanar surface comprising an exposed top surface of first ILD 76, spacers 72, and remaining portions of the HKMG gate layers 66 and 64 inlaid between respective spacers 72.

A second ILD layer 78 may be deposited over the first ILD layer 76, as illustrated in FIG. 1. In some embodiments, the insulating materials to form the first ILD layer 76 and the second ILD layer 78 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 76 and the second ILD layer 78 may be deposited using any suitable method, such as CVD, physical vapor deposition (PVD), ALD, PEALD, PECVD, SACVD, FCVD, spin-on, and/or the like, or a combination thereof.

The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

As illustrated in FIG. 1, electrodes of electronic devices formed in the substrate 50 may be electrically connected to conductive features of a first interconnect level 100A using conductive connectors (e.g., contacts 74) formed through the intervening dielectric layers. In the example illustrated in FIG. 1, the contacts 74 make electrical connections to the source and drain regions 54 of FinFET 60. Contacts 74 to gate electrodes are typically formed over STI regions 62. A separate gate electrode 64 (shown in the left in FIG. 1) illustrates such contacts. The contacts may be formed using photolithography techniques. For example, a patterned mask may be formed over the second ILD 78 and used to etch openings that extend through the second ILD 78 to expose a portion of gate electrodes over STI regions 62, as well as etch openings over the fins 58 that extend further, through the first ILD 76 and the CESL (not shown) liner below first ILD 76 to expose portions of the source and drain regions 54. In some embodiments, an anisotropic dry etch process may be used wherein the etching is performed in two successive steps. The etchants used in the first step of the etch process have a higher etch rate for the materials of the first and second ILD layers 76 and 78 relative to the etch rate for the materials used in the gate electrodes 64 and the CESL, which may be lining the top surface of the heavily-doped regions of the source and drain regions 54. Once the first step of the etch process exposes the CESL, the second step of the etch process may be performed wherein the etchants may be switched to selectively remove the CESL.

In some embodiments, a conductive liner may be formed in the openings in the first ILD layer 76 and the second ILD layer 78. Subsequently, the openings are filled with a conductive fill material. The liner comprises barrier metals used to reduce out-diffusion of conductive materials from the contacts 74 into the surrounding dielectric materials. In some embodiments, the liner may comprise two barrier metal layers. The first barrier metal comes in contact with the semiconductor material in the source and drain regions 54 and may be subsequently chemically reacted with the heavily-doped semiconductor in the source and drain regions 54 to form a low resistance ohmic contact, after which the unreacted metal may be removed. For example, if the heavily-doped semiconductor in the source and drain regions 54 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the second ILD 78. The resulting conductive plugs extend into the first and second ILD layers 76 and 78 and constitute contacts 74 making physical and electrical connections to the electrodes of electronic devices, such as the tri-gate FinFET 60 illustrated in FIG. 1. In this example, contacts to electrodes over STI 62 and to electrodes over fins 58 are formed simultaneously using the same processing steps. However, in other embodiments these two types of contacts may be formed separately.

As illustrated in FIG. 1, multiple interconnect levels may be formed, stacked vertically above the contact plugs 74 formed in the first and second ILD layers 76 and 78, in accordance with a back end of line (BEOL) scheme adopted for the integrated circuit design. In the BEOL scheme illustrated in FIG. 1, various interconnect levels have similar features. However, it is understood that other embodiments may utilize alternate integration schemes wherein the various interconnect levels may use different features. For example, the contacts 74, which are shown as vertical connectors, may be extended to form conductive lines which transport current laterally.

In this disclosure, the second interconnect level comprises conductive vias and lines embedded in an intermetal dielectric (IMD) layer. In addition to providing insulation between various conductive elements, an IMD layer may include one or more dielectric etch stop layers to control the etching processes that form openings in the IMD layer. Generally, vias conduct current vertically and are used to electrically connect two conductive features located at vertically adjacent levels, whereas lines conduct current laterally and are used to distribute electrical signals and power within one level. In the BEOL scheme illustrated in FIG. 1, conductive vias 104A connect contacts 74 to conductive lines 108A and, at subsequent levels, vias connect lower lines to upper lines (e.g., a pair of lines 108A and 108B can be connected by via 104B). Other embodiments may adopt a different scheme. For example, vias 104A may be omitted from the second level and the contacts 74 may be configured to be directly connected to lines 108A.

Still referring to FIG. 1, the first interconnect level 100A may be formed using, for example, a dual damascene process flow. First, a dielectric stack used to form IMD layer 110A may be deposited using one or more layers of the dielectric materials listed in the description of the first and second ILD layers 76 and 78. In some embodiments, IMD layer 110A includes an etch stop layer (not shown) positioned at the bottom of the dielectric stack. The etch stop layer comprises one or more insulator layers (e.g., SiN, SiC, SiCN, SiCO, CN, combinations thereof, or the like) having an etch rate different than an etch rate of an overlying material. The techniques used to deposit the dielectric stack for IMD may be the same as those used in forming the first and second ILD layers 76 and 78.

Appropriate photolithography and etching techniques (e.g., anisotropic RIE employing fluorocarbon chemistry) may be used to pattern the IMD layer 110A to form openings for vias and lines. The openings for vias may be vertical holes extending through IMD layer 110A to expose a top conductive surface of contacts 74, and openings for lines may be longitudinal trenches formed in an upper portion of the IMD layer 110A. In some embodiments, the method used to pattern holes and trenches in IMD 110A utilizes a via-first scheme, wherein a first photolithography and etch process form holes for vias, and a second photolithography and etch process form trenches for lines. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of IMD layer 110A and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Several conductive materials may be deposited to fill the holes and trenches forming the conductive features 104A and 108A of the first interconnect level 100A. The openings may be first lined with a conductive diffusion barrier material and then completely filled with a conductive fill material deposited over the conductive diffusion barrier liner. In some embodiments, a thin conductive seed layer may be deposited over the conductive diffusion barrier liner to help initiate an electrochemical plating (ECP) deposition step that completely fills the openings with a conductive fill material.

The diffusion barrier conductive liner in the vias 104A and lines 108A comprises one or more layers of TaN, Ta, TiN, Ti, Co, or the like, or combinations thereof. The conductive fill layer in 104A and 108A may comprise metals such as Cu, Al, W, Co, Ru, or the like, or combinations thereof, or multi-layers thereof. The conductive materials used in forming the conductive features 104A and 108A may be deposited by any suitable method, for example, CVD, PECVD, PVD, ALD, PEALD, ECP, electroless plating and the like. In some embodiments, the conductive seed layer may be of the same conductive material as the conductive fill layer and deposited using a suitable deposition technique (e.g., CVD, PECVD, ALD, PEALD, or PVD, or the like).

Any excess conductive material over the IMD 110A outside of the openings may be removed by a planarizing process (e.g., CMP) thereby forming a top surface comprising dielectric regions of IMD 110A that are substantially coplanar with conductive regions of 108A. The planarization step embeds the conductive vias 104A and conductive lines 108A into IMD 110A, as illustrated in FIG. 1.

The interconnect level positioned vertically above the first interconnect level 100A in FIG. 1, is the second interconnect level 100B. In some embodiments, the structures of the various interconnect levels (e.g., the first interconnect level 100A and the second interconnect level 100B) may be similar. In the example illustrated in FIG. 1, the second interconnect level 100B comprises conductive vias 104B and conductive lines 108B embedded in an insulating film IMD 110B having a planar top surface. The materials and processing techniques described above in the context of the first interconnect level 100A may be used to form the second interconnect level 100B and subsequent interconnect levels.

Although an example electronic device (FinFET 60) and example interconnect structures making connections to the electronic device are described, it is understood that one of ordinary skill in the art will appreciate that the above examples are provided for illustrative purposes only to further explain applications of the present embodiments, and are not meant to limit the present embodiments in any manner.

Figure 2:
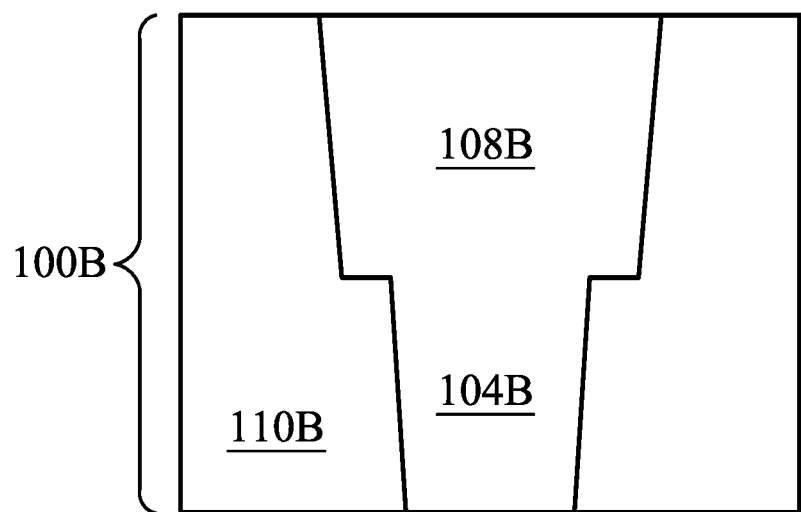

FIG. 2 illustrates a detailed view of region 101 of FIG. 1, showing an interconnect level 100B at an initial stage of fabrication of the MRAM array. In FIG. 2, a conductive line 108B at the interconnect level 100B has been illustrated as the conductive feature to which a bottom electrode (BE) of an MTJ memory cell will be electrically coupled at a subsequent processing step, in accordance with some embodiments. The conductive line 108B is shown for illustrative purposes only; it is understood that the BE and MTJ memory cell may be formed on a conductive line in any metallization layer suitable in a particular design. In FIG. 2, a via 104B and a conductive line 108B are shown embedded in an insulating film IMD 110B. The top dielectric surface of IMD 110B is shown to be substantially coplanar with the top conductive surface of conductive line 108B, within process variations.

Figure 3:
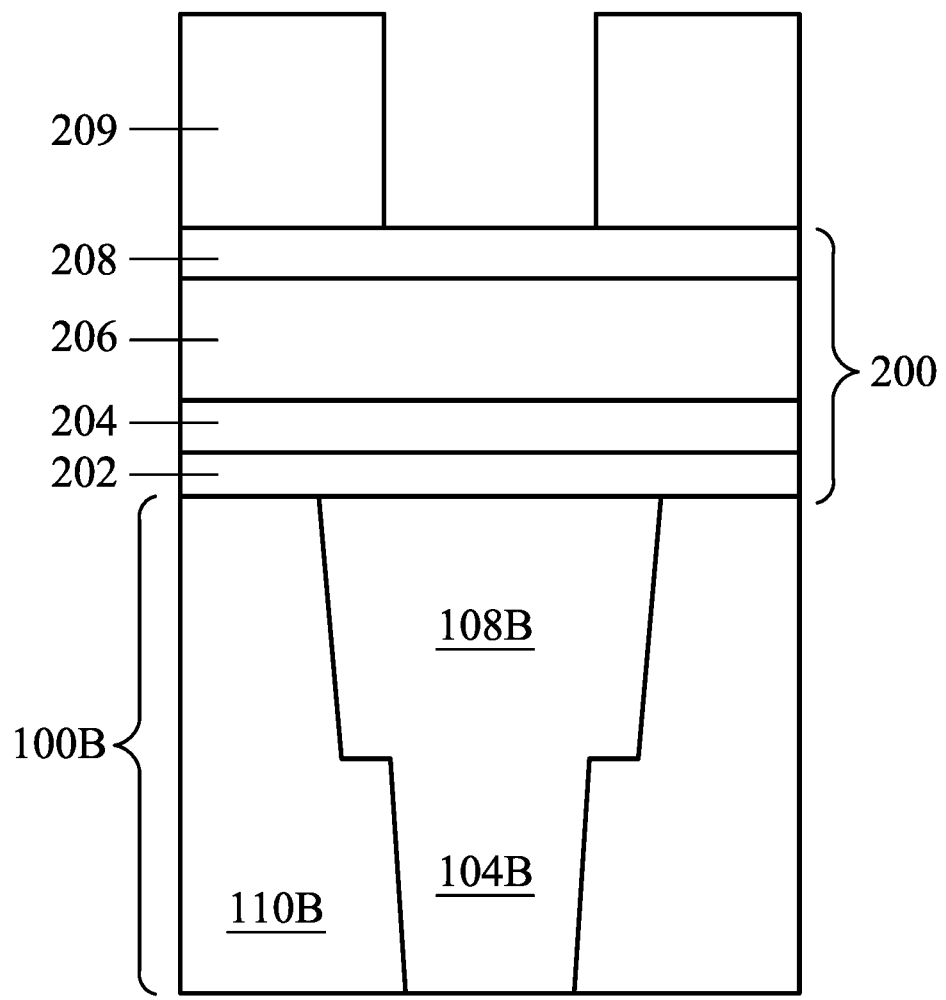

FIG. 3 illustrates a dielectric stack 200 comprising one or more dielectric layers formed successively over the interconnect level 100B in accordance with some embodiments. In some embodiments, the dielectric stack 200 may be positioned between a subsequently formed MRAM cell and the conductive line 108B. A first dielectric layer 202 may be formed over the planarized top surface of the interconnect level 100B, and a second dielectric layer 204 formed over first dielectric layer 202. In the example structure illustrated in FIG. 3, the first and second dielectric layers 202 and 204 may be used collectively as an etch stop layer during a subsequent etching step used to form vertical holes extending through the dielectric stack 200. In some embodiments, the first and second dielectric layers 202 and 204 comprise AlN and $AlO_x$, respectively, although other dielectric materials (e.g., SiN, SiC, and/or the like, or a combination thereof) may be used. In some embodiments, the first dielectric layer 202 may have a thickness from about 10 Å to about 1000 Å, and the second dielectric layer 204 may have a thickness from about 10 Å to about 1000 Å.

Still referring to FIG. 3, a third dielectric layer 206, formed over the second dielectric layer 204, provides insulation between conductive line 108B and the subsequently formed BE of an MTJ memory cell of an MRAM array. In this example, the third dielectric layer 206 may comprise a silicon oxide deposited using, for example, a CVD technique with tetraethyl orthosilicate (TEOS) as a precursor. Other embodiments may use other insulators, for example, PSG, BSG, BPSG, USG, FSG, SiOCH, CDO, flowable oxide, or porous oxides (e.g., xerogels/aerogels), or the like, or a combination thereof. In some embodiments, the third dielectric layer 206 may have a thickness from about 50 Å to about 1000 Å.

FIG. 3 further illustrates an anti-reflective coating (ARC) 208 overlying the third dielectric layer 206 of the example dielectric stack 200, and a patterned photoresist layer 209 overlying the ARC 208. Anti-reflective coatings improve photo resolution by reducing optical distortions associated with specular reflections, thin-film interference, and/or standing waves that may inhibit sharp feature definition during imaging of photoresist material. In the illustrated example, the ARC 208 may comprise a nitrogen-free ARC (NFARC) (e.g., an organic ARC, such as $C_xH_xO_x$, or inorganic ARC, such as SiC) to further improve feature definition during patterning of photoresist layer 209. In some embodiments, the ARC 208 may have a thickness from about 50 Å to about 1000 Å. The various dielectric layers of dielectric stack 200 may be formed by any suitable deposition technique, e.g., CVD, PECVD, ALD, PEALD, PVD, spin-on and/or the like, or a combination thereof. The structure of the dielectric stack 200 is provided as example only; other insulating structures may be utilized.

Figure 4:
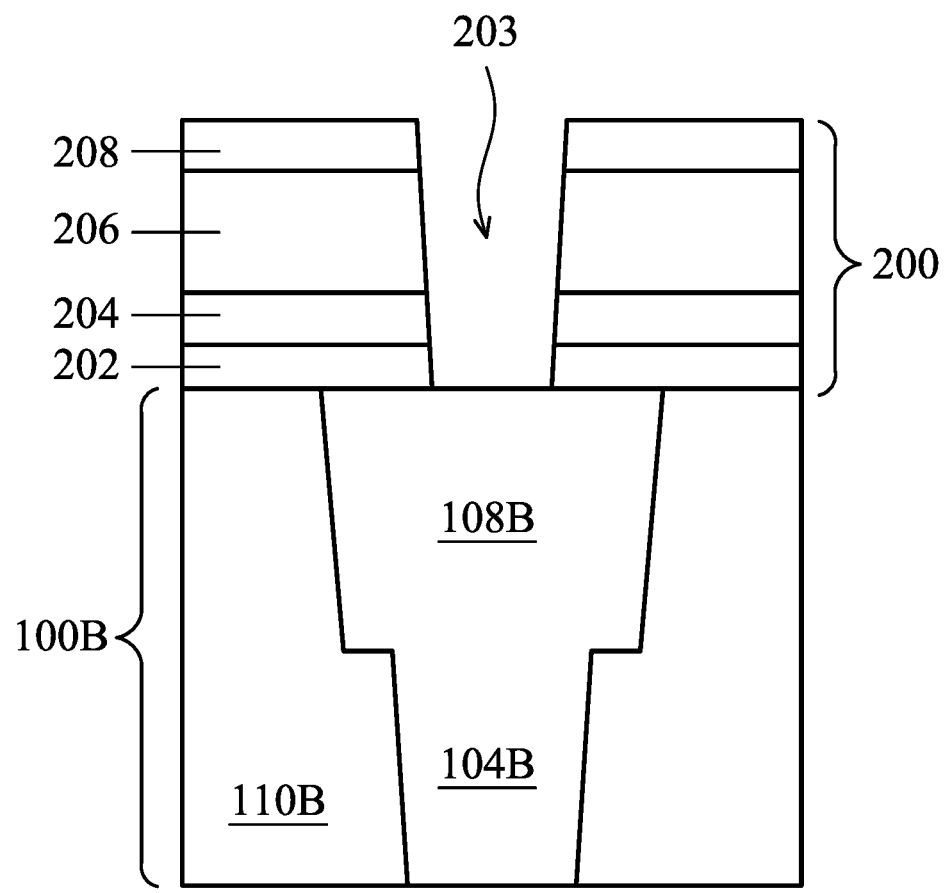

FIG. 4 illustrates a hole 203 extending through the dielectric stack 200 to expose a portion of the conductive top surface of the conductive line 108B inlaid in the insulating film IMD 110B. The dielectric stack 200 may be patterned using the patterned photoresist layer 209 as an etch mask to etch holes 203. Any acceptable etching technique may be used, for example, RIE processes described earlier with reference to FIG. 1 used to form vias and lines such as the via 104B and the conductive line 108B. The etching process may include one or more etching steps, for example, a first etch step may be performed using etchants to remove an exposed portion of the ARC layer 208, and a second etch step may be performed using etchants that remove the third dielectric layer 206 but leave the first and second dielectric layers 202 positioned below the third dielectric layer 206 relatively unetched. A third etch step may remove an exposed portion of the first and second dielectric layers 202 and 204 and expose a portion of the top conductive surface of conductive line 108B, as illustrated in FIG. 4. In some embodiments, the first and second etch steps may be the same step.

Figure 5:
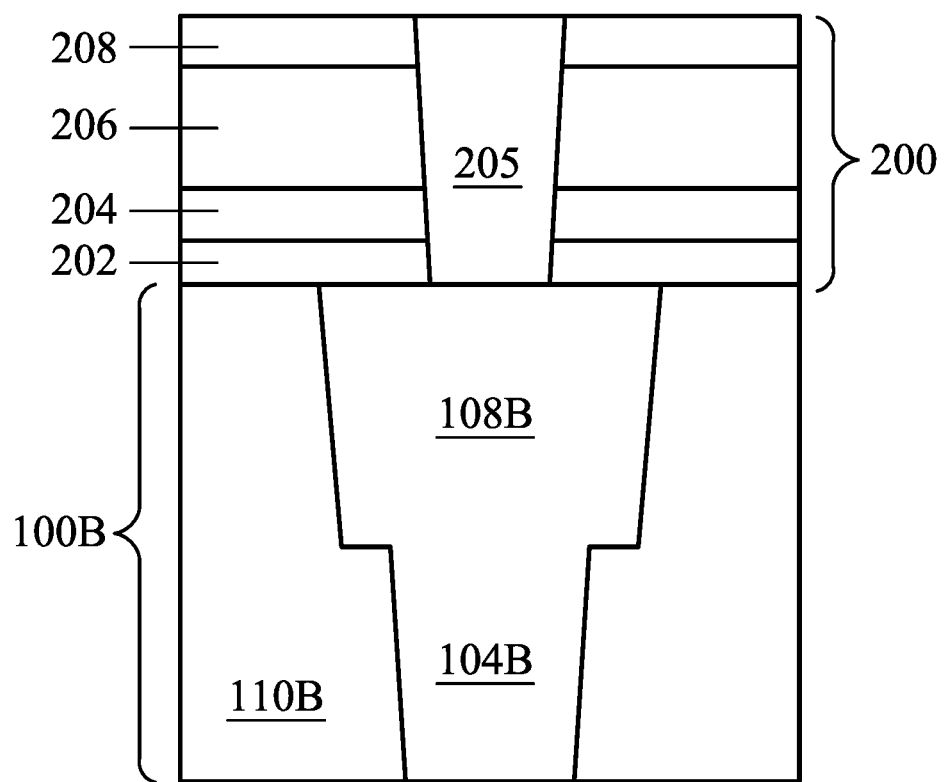

FIG. 5 illustrates a BE via 205 formed in the dielectric stack 200 and electrically connected to conductive line 108B. The BE via 205 may comprise one or more layers. For example, the hole 203 (see FIG. 4) may be filled with a conductive diffusion barrier liner and a conductive fill material filling the hole 203. A planarizing process (e.g., CMP) may be performed to remove excess conductive material from over the top surface of the dielectric stack 200 to form a dielectric surface that is substantially coplanar with the top conductive surface of the BE via 205, as illustrated in FIG. 5.

In some embodiments, (including the example illustrated in FIG. 5) the materials and processing techniques used to form the BE via 205 may be the same as those used to form vias at the interconnect levels described above (e.g., 104A and 104B). In other embodiments, the conductive materials and processes used to form BE via 205 may be different from the conductive materials and processes used to form the conductive features of the interconnect levels formed in prior, or subsequent, processing steps. For example, Cu may be used as the conductive fill material in 104A and 104B, while TiN may be used as the conductive fill material in BE via 205. In another embodiment, another conductive material such as Co may be used as the conductive fill material in BE via 205.

Figure 6:
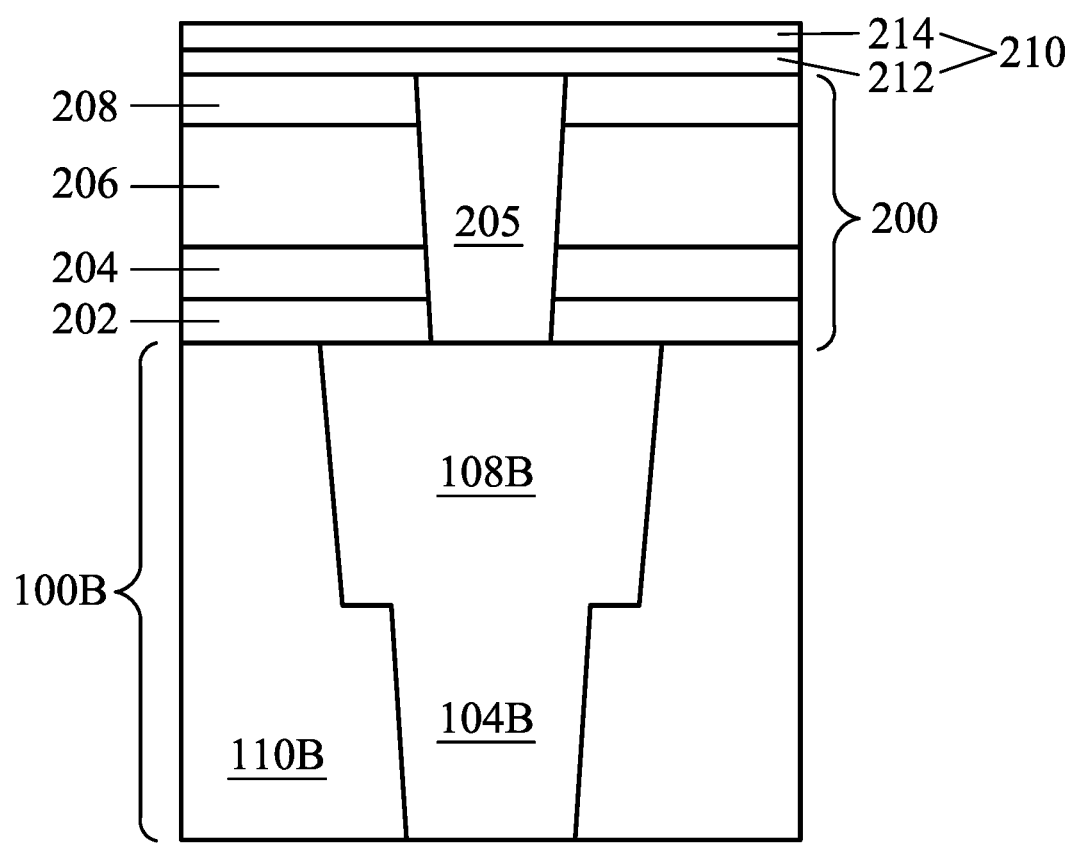

FIG. 6 illustrates a conductive BE layer 210 formed vertically adjacent to the top surface of the BE via 205 and the dielectric stack 200. In some embodiments, the BE layer 210 comprises multiple layers of conductive materials deposited successively, as illustrated in FIG. 6. For example, a conductive layer 212 comprising, for example, TaN may be formed on the top surface of the dielectric stack 200 and the BE via 205, and a conductive layer 214 comprising, for example, TiN may be formed over the conductive layer 212, in accordance with some embodiments. In other embodiments, the BE layer 210 may include either more or less than two conductive layers, and may use other conductive materials (e.g., Cu, Al, Ta, W, Ti, or the like). The first and second conductive layers 212 and 214 may be deposited using any suitable technique, such as CVD, ALD, PECVD, PEALD, or PVD, or the like, or a combination thereof. In some embodiments, the first conductive layer 212 may have a thickness from about 10 Å to about 500 Å, and the second conductive layer 214 may have a thickness from about 10 Å to about 500 Å. The top surface of BE layer 210 may be planarized using, for example, a CMP process, in accordance with some embodiments.

Figure 7:
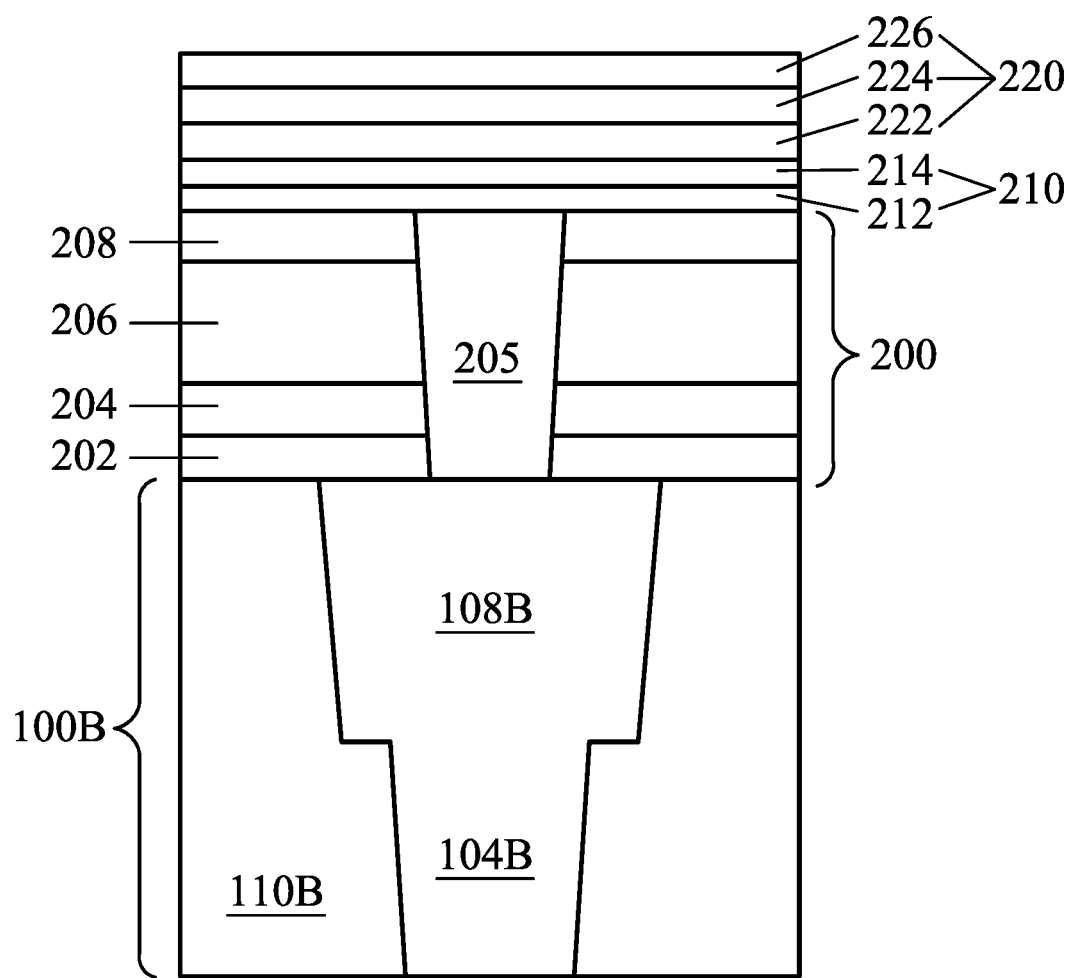

FIG. 7 illustrates a multilayered MTJ layer 220 formed vertically adjacent to the top surface of the BE layer 210. The MTJ may be formed by depositing a plurality of conductive and dielectric layers, collectively referred to as MTJ layer 220. The multilayered MTJ layer 220 formed over the BE layer 210 may include various layers formed of different combinations of materials. In an example embodiment, MTJ layer 220 includes a pinning layer 222, a tunnel barrier layer 224, and a free layer 226, formed successively. In an example embodiment, the pinning layer 222 is formed of PtMn, the tunnel barrier layer 224 is formed of MgO over the pinning layer 222, and the free layer 226 is formed of $Co_xFe_yB_{1-x-y}$ alloy over the MgO tunnel barrier layer 224. In some embodiments, MTJ layer 220 may use other materials, such as, alloys of Mn with a metal other than Pt (e.g., IrMn, RhMn, NiMn, PdPtMn, or FeMn) to form a pinning layer 222, other dielectrics (e.g., $AlO_x$) to form a tunnel barrier layer 224, and $CoFe_yB_{1-x-y}$ alloy to form the free layer 226. In addition, MTJ layer 220 may have other variations including other layers, such as anti-ferromagnetic layers (e.g., a multilayered $[Co/Pt]_n$ synthetic anti-ferromagnetic (SyAF) layer, etc.). The materials for the MTJ layer 220 may be deposited using one or more techniques, such as CVD, PECVD, PVD, ALD, or PEALD, or the like, or a combination thereof. In some embodiments, the tunnel barrier layer 224 may be formed by depositing a metal and then oxidizing the metal to convert the metal to a dielectric using, for example, a plasma oxidation technique. It should be recognized that the MTJ layer 220 may have many variations, which are also within the scope of the present disclosure.

Figure 8A:
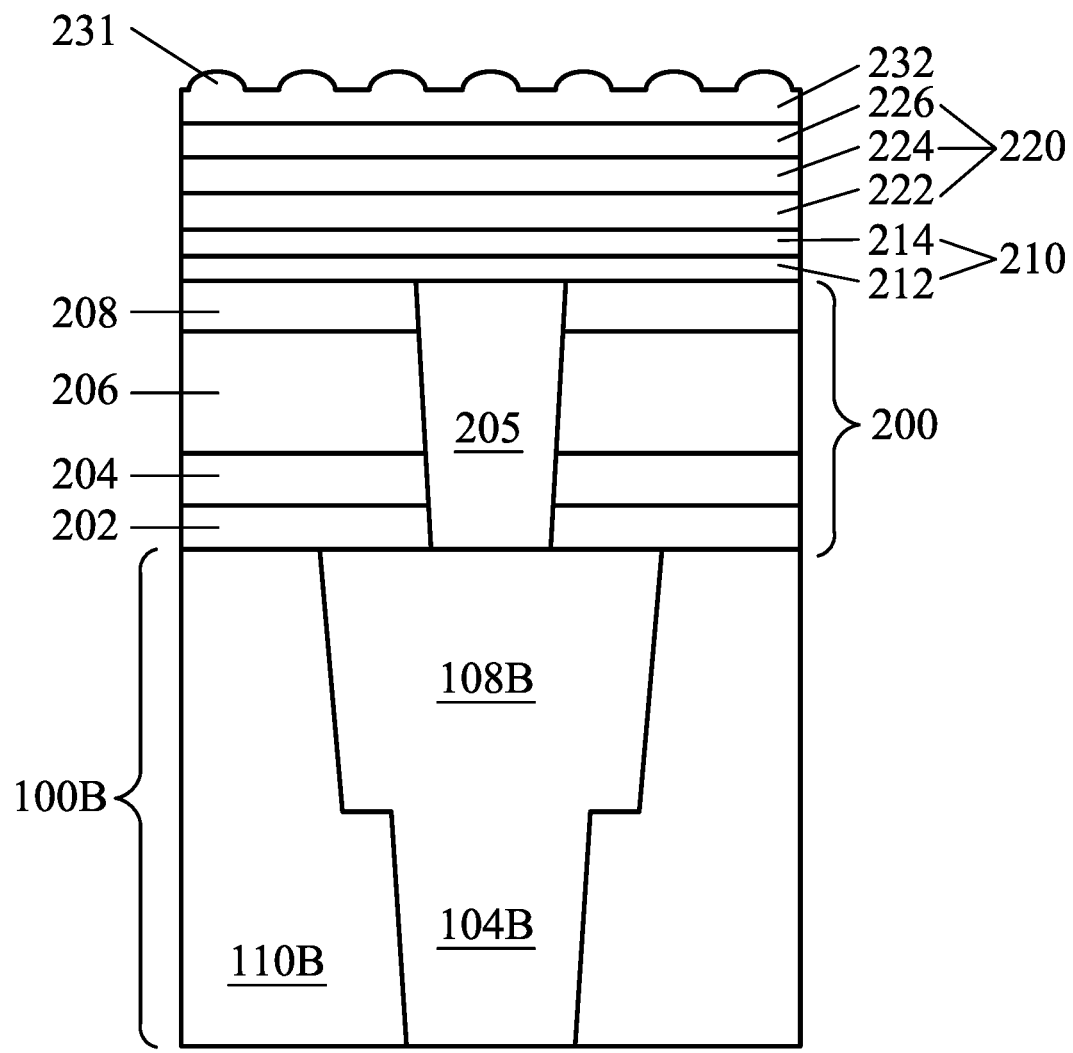

FIG. 8A illustrates a first conductive layer 232 formed over the multilayered MTJ layer 220 as a first stage in a formation of a top electrode (TE). The multilayered MTJ layer 220 in FIG. 8A is vertically interposed between the BE layer 210 and the first conductive layer 232 of the TE, and both physically and electrically in contact with the BE layer 210 and first conductive layer 232 of the TE at their respective interfaces. The bottom conductive surface of the first conductive layer 232 of the TE is shown physically and electrically in contact with the top conductive free layer 226 of the MTJ layer 220. The example first conductive layer 232 of the TE in FIG. 8A comprises TiN, in accordance with some embodiments. In other embodiments, the first conductive layer 232 of the TE may use other conductive materials (e.g., Cu, Al, W, Ti, or the like). The first conductive layer 232 may be formed after a degassing is performed. The first conductive layer 232 may be formed to have a thickness between about 10 nm and about 200 nm. The deposition of the first conductive layer 232 may be performed at a process temperature between about 200° C. and about 400° C., in a chamber pressure of between about 10 mtorr to about 1000 mtorr, over a processing time between about 10 seconds and 1000 seconds, using a DC plasma power (as measured at the power supply) between about 5 KW and about 30 KW, and a bias power between about 20 W and about 100 W.

FIG. 8A further illustrates spike points 231 on the surface of the first conductive layer 232. Spike points 231 may be induced due to high grain size, e.g. between about 12 nm and about 25 nm, formed in the first conductive layer 232 by the long plasma deposition time (between about 10 seconds and about 1000 seconds) and high temperature (between about 200° C. and about 500° C.) needed for the deposition of a high thickness film with a thickness between about 10 nm and about 500 nm.

Figure 8B:
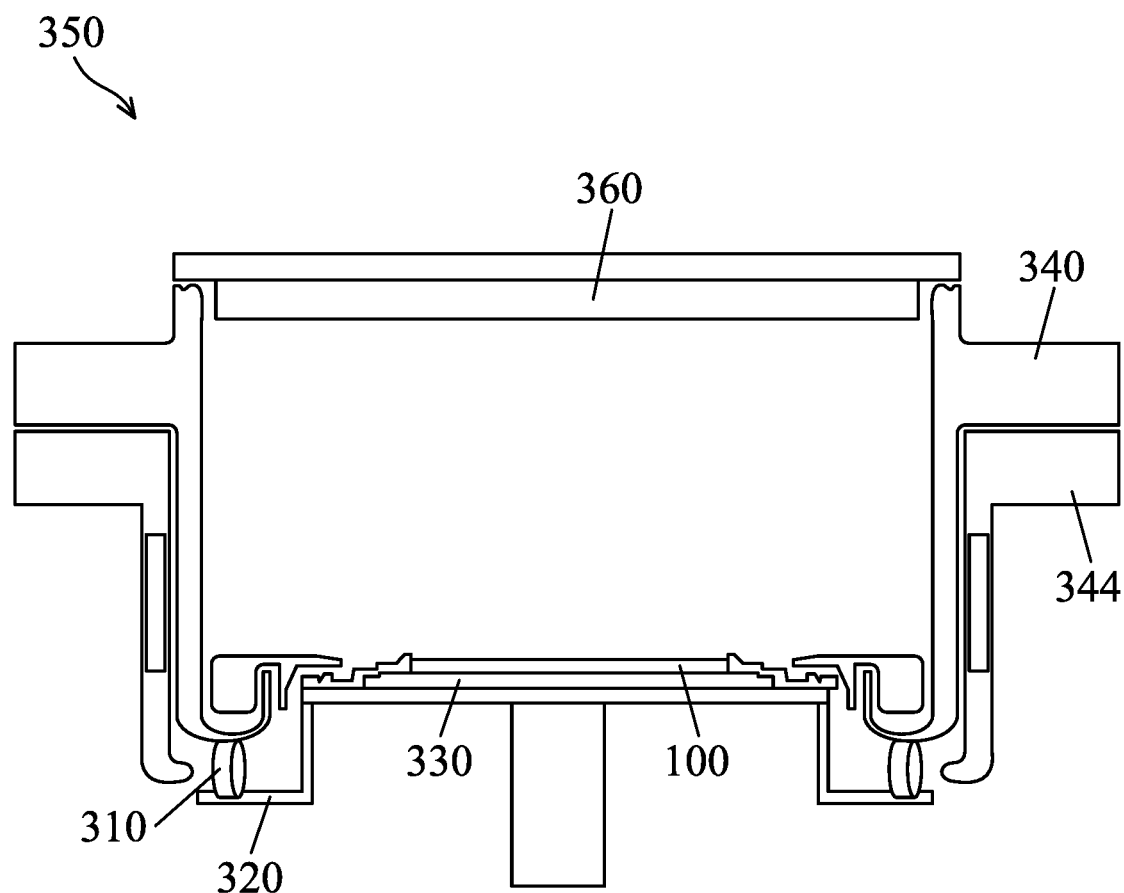
FIG. 8B illustrates cross-sectional views of a treatment chamber, in accordance with some embodiments.

FIG. 8B illustrates a treatment chamber 350 in which the first conductive layer 232 may be formed on MTJ layer 220 using a deposition process such as PVD. The deposition process may be performed at a lower pressure and/or with a lower bias power than a later RF plasma treatment, as described below in reference to FIGS. 9A-F. The treatment chamber 350 may comprise a grounding strip 310, a grounding bracket 320, an electrostatic chuck 330, a first shield 340, a second shield 344, and a target 360. The semiconductor structure 100 is disposed on the electrostatic chuck 330 with the MTJ layer 220 exposed on its top surface.

Figure 9A:
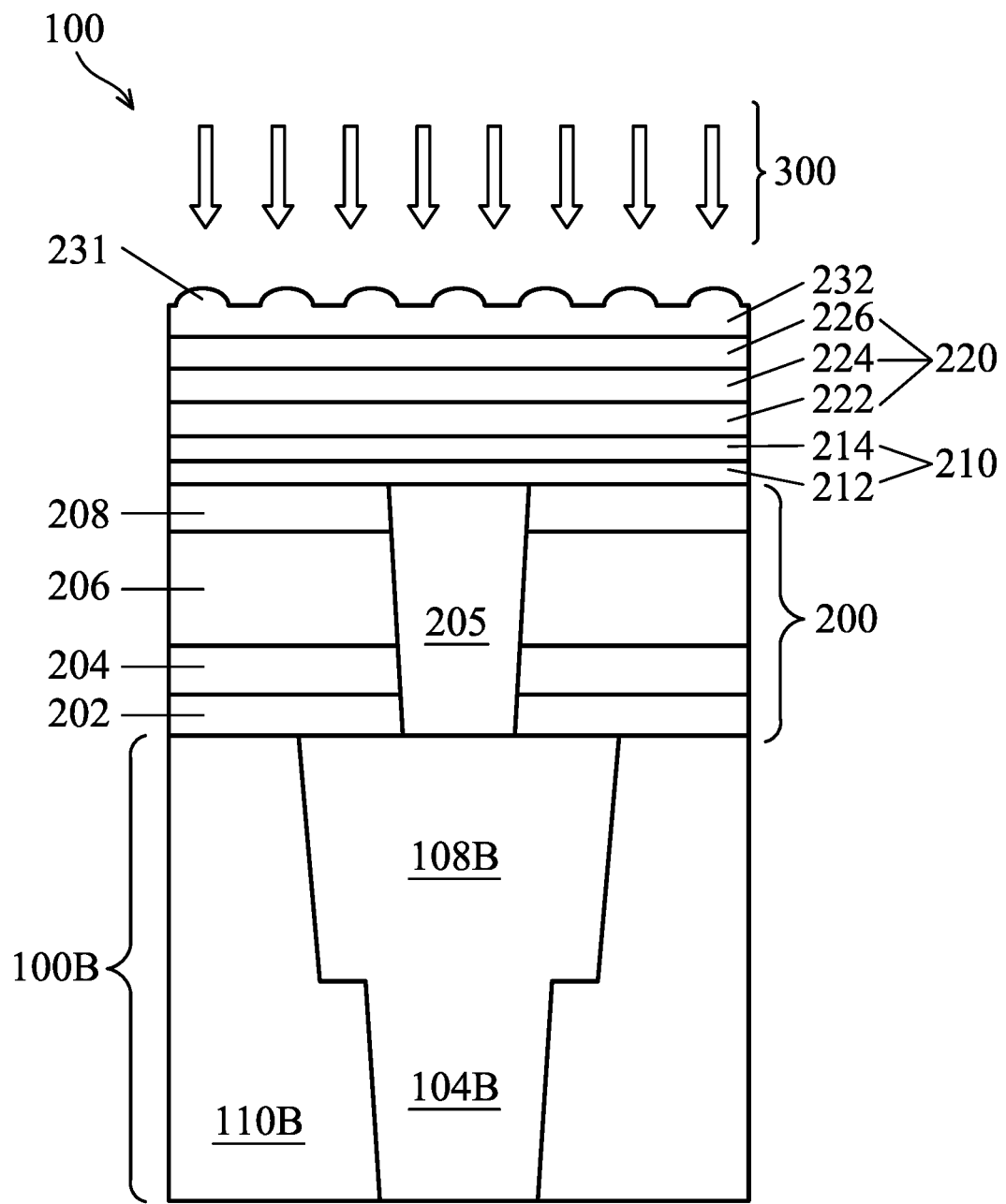
FIGS. 9A through 9F illustrate various views of a plasma treatment on a conductive layer of a top electrode (TE) of an MTJ storage element, in accordance with some embodiments.

FIGS. 9A through 9F illustrate a method for reducing the spike points 231 with an RF plasma treatment, in accordance with some embodiments. FIG. 9A illustrates an RF plasma treatment 300 applied to the first conductive layer 232 after the deposition of the first conductive layer 232. The RF plasma treatment 300 may be performed in situ after the deposition of the first conductive layer 232.

Figure 9B:
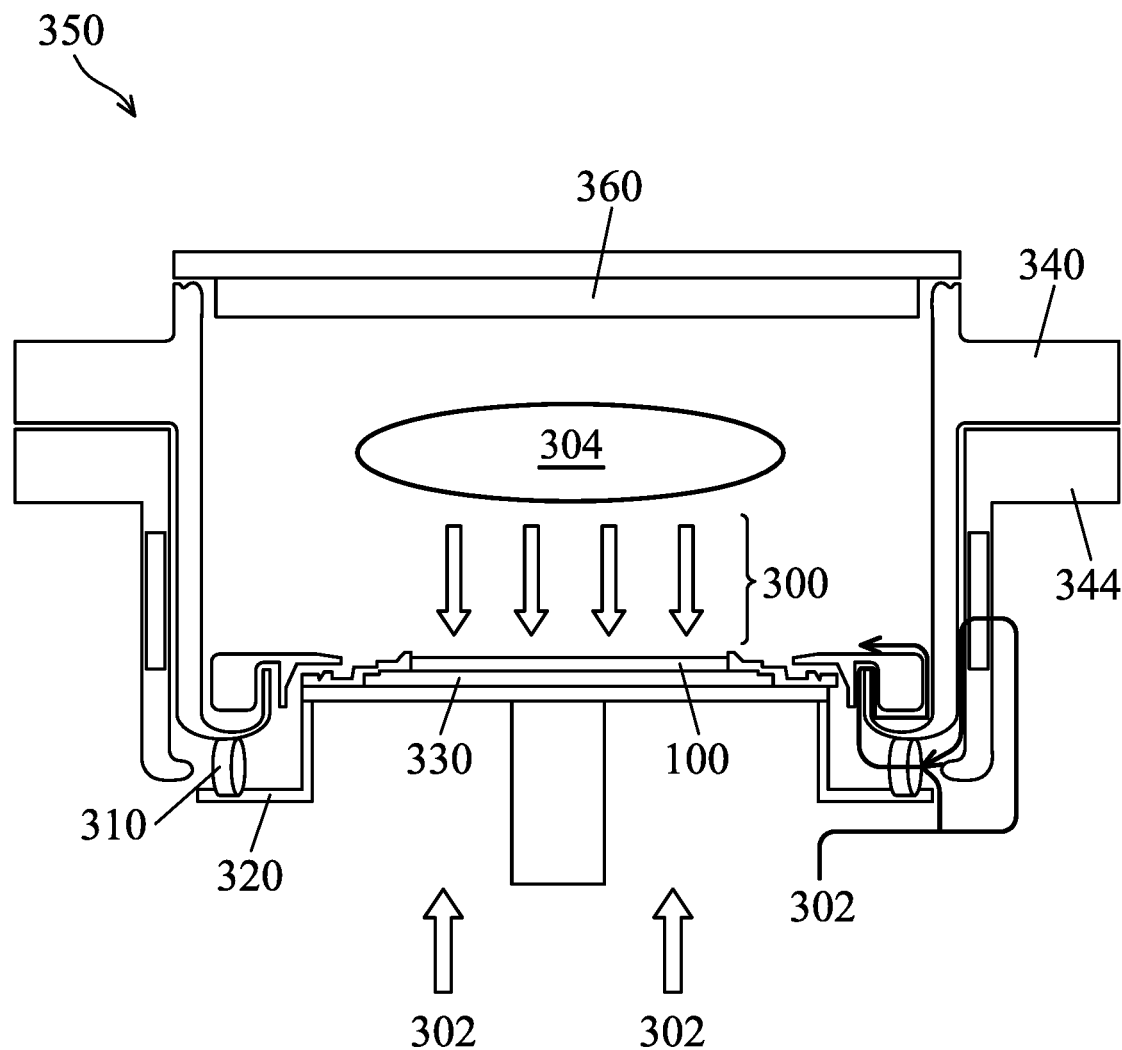

FIG. 9B illustrates an embodiment of the RF plasma treatment 300 being performed in the treatment chamber 350. In an embodiment, the RF plasma treatment 300 is an AC bias plasma treatment. The semiconductor structure 100 is disposed on the electrostatic chuck 330 with the first conductive layer 232 exposed on its top surface. The treatment gas 302 enters the treatment chamber 350 following the path indicated in FIG. 9B and is excited into a RF plasma 304. The RF plasma 304 bombards the top surface of the semiconductor structure 100 as illustrated in FIG. 9B. The treatment gas 302 may be a suitable gas such as $N_2$, Ar, $H_2$, $O_2$, or the like. In an embodiment, the treatment gas 302 is $N_2$ and the resulting RF plasma 304 is a nitrogen plasma. The treatment gas 302 may be supplied at a flow rate of between about 50 sccm to about 2000 sccm, while the RF plasma treatment 300 is performed at a pressure of between about 10 mtorr to about 1000 mtorr. The AC bias power of the RF plasma treatment 300 may be between about 10 W to about 1000 W, as measured at the power supply output.

However, the RF plasma treatment may be performed at a higher pressure and/or with higher bias power than the first conductive layer 232, as described above in reference to FIGS. 8A and 8B. For example, in an embodiment in which the deposition of the first conductive layer 232 is performed at a pressure of about 10 mtorr, the RF plasma treatment may be performed at a higher pressure, such as being performed at a pressure of about 1000 mtorr. Similarly, in an embodiment in which the deposition of the first conductive layer 232 is performed at a bias power of 20 W, the RF plasma treatment may be performed at a higher bias power, such as a bias power of about 1000 W. However, any suitable combination of pressures and biases may be utilized.

The RF plasma treatment 300 may be performed at a temperature between about 200° C. to about 400° C. It is advantageous for the flow rate to be at least about 50 sccm in order to provide sufficient $N_2$ to form plasma, and it is advantageous for the flow rate to be about 2000 sccm or less because exceeding 2000 sccm may cause an arcing issue by overproduction of plasma. It is advantageous for the AC bias power to be at least about 10 W because the AC bias can control the film quality, and it is advantageous for the flow rate to be about 1000 W or less because higher AC bias can cause an arcing issue. It is advantageous for the temperature to be at least about 200° C. in order to keep plasma density, and it is advantageous for the temperature to be about 400° C. or less because higher temperatures may cause an arcing issue.

Figure 9C:
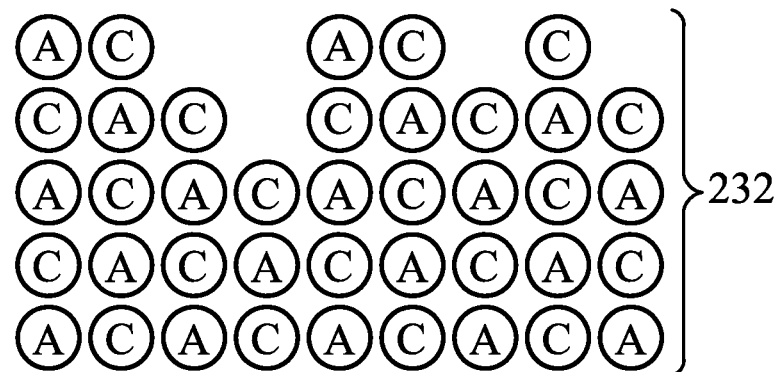
Figure 9D:
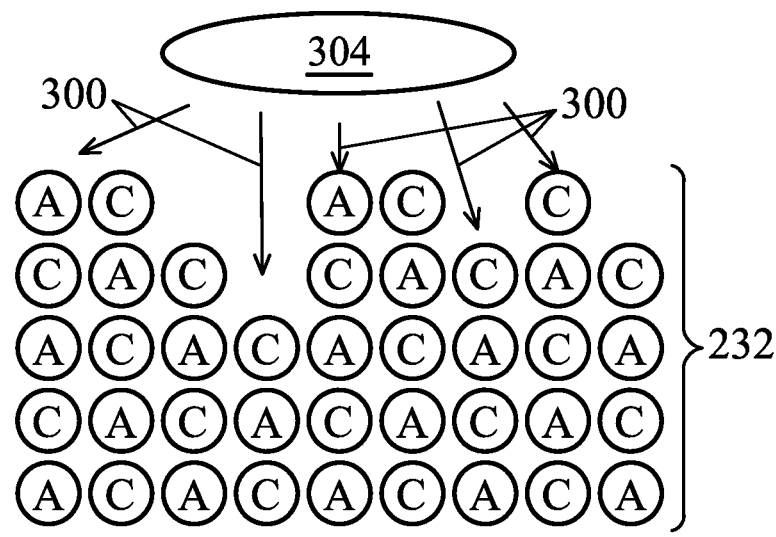
Figure 9E:
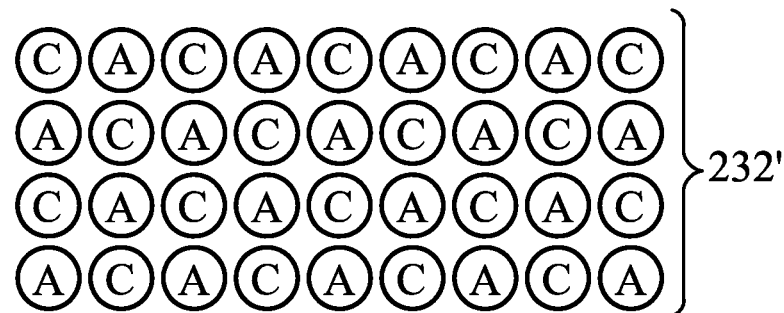

FIGS. 9C, 9D, and 9E illustrate the action of the RF plasma treatment 300 on the first conductive layer 232, in accordance with some embodiments. FIG. 9C illustrates a cross section of a portion of the top surface of the first conductive layer 232, showing the ionic structure of cations C and anions A. In embodiments where the first conductive layer 232 consists substantially of TiN, the cations C are Ti atoms and the anions A are N atoms. In FIG. 9D, the RF plasma treatment 300 is performed by bombarding the first conductive layer 232 with the RF plasma 304. FIG. 9E illustrates the result after the RF plasma treatment 300 has been performed. Irregularities in the top surface of the first conductive layer 232 have been removed. In embodiments where the first conductive layer 232 consists substantially of TiN and the RF plasma 304 comprises an $N_2$ plasma, N atoms may fill gaps in the TiN lattice structure. The RF plasma treatment 300 can also remove surface particles on the first conductive layer 232. The RF plasma treatment 300 may cause a reduction in the height of the first conductive layer 232.

Figure 9F:
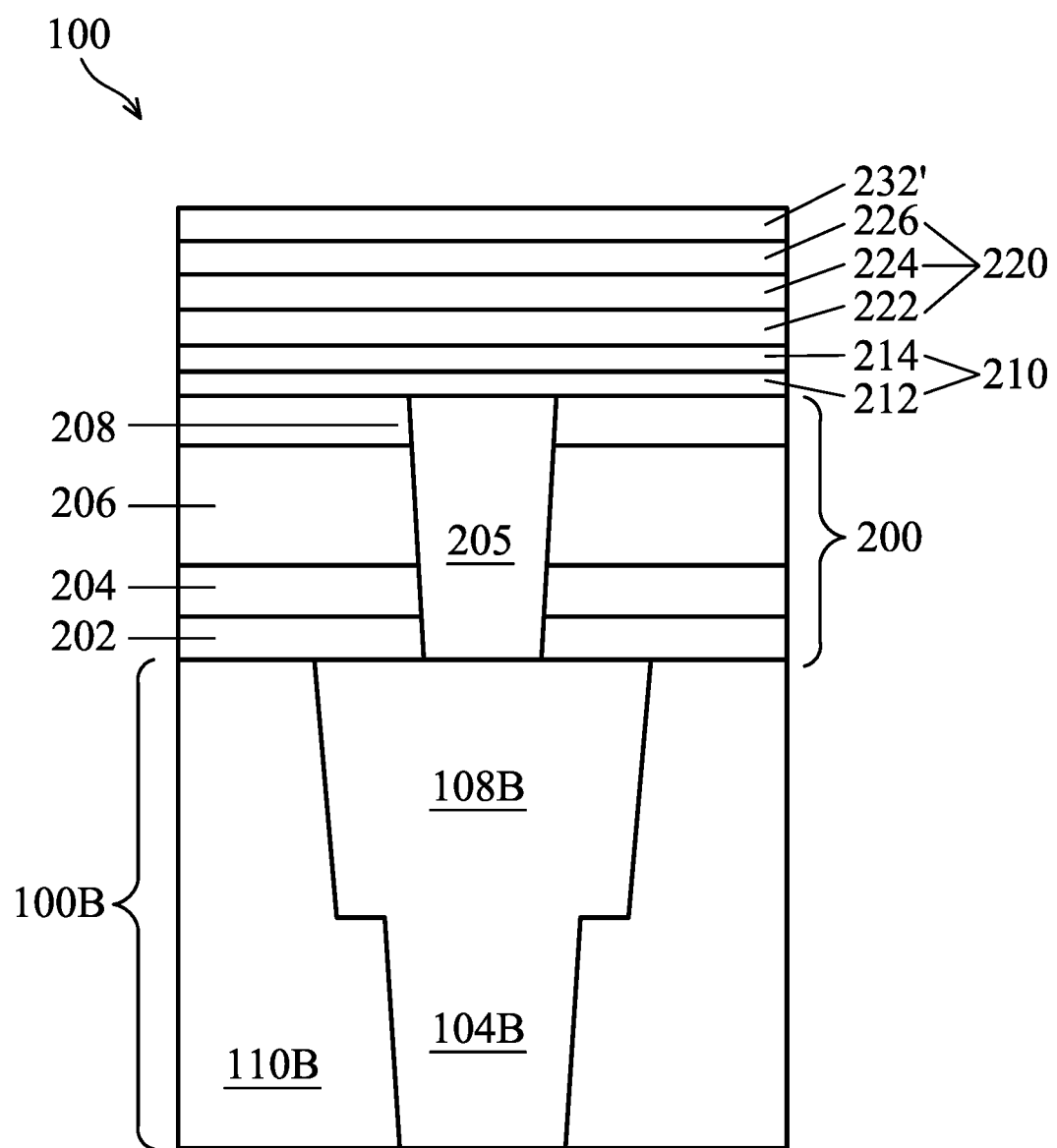

FIG. 9F illustrates the end result of applying the RF plasma treatment 300. The first conductive layer 232 with spike points 231, as illustrated above in FIG. 9A, has been converted to a smoothed first conductive layer 232'. The spike points 231 have been removed by the RF plasma treatment 300 in FIGS. 9A, 9B, and 9D. The smoothed first conductive layer 232' may have a strongly defined crystallographic direction (200). The resulting order of diffraction n of the smoothed first conductive layer 232' may be greater than 1.4, where n is the order of diffraction in Bragg's law $2d \sin \theta = n\lambda$.

The smoothed first conductive layer 232' produced by the RF plasma treatment 300 has a flatter top surface without spike points 231. The RF plasma treatment 300 may also remove surface particles adhering to the top surface. By removing these defect causing structures, increased yields and performance can be achieved.

Figure 10A:
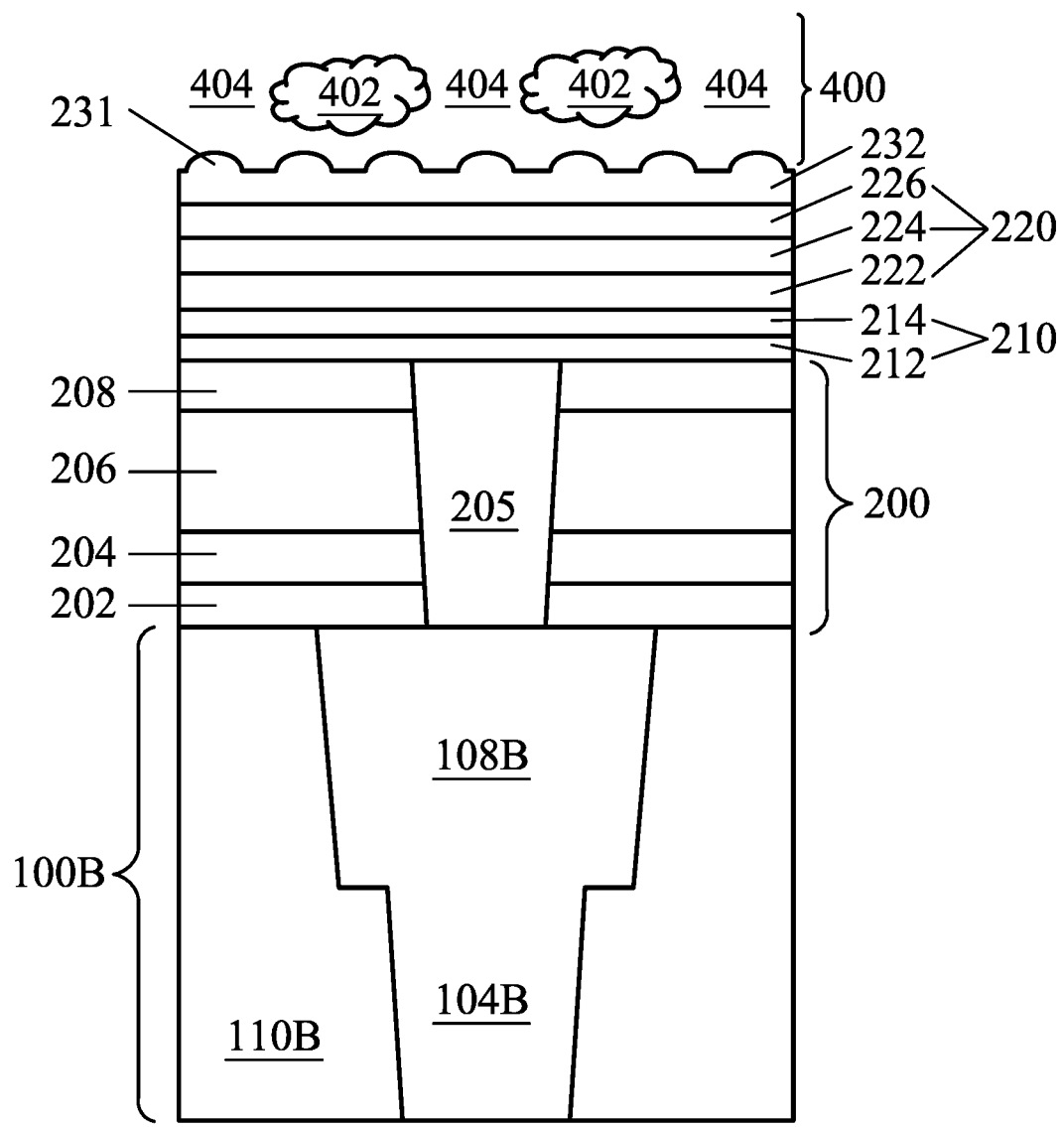
FIGS. 10A through 10F illustrate various views of a nitrogen soak on a conductive layer of a TE of an MTJ storage element, in accordance with some embodiments.

FIGS. 10A through 10F illustrate another embodiment of a method for reducing the spike points 231 with a gaseous soak treatment, in accordance with some embodiments. FIG. 10A illustrates a gaseous soak treatment 400 applied to the first conductive layer 232 after the deposition of the first conductive layer 232. The gaseous soak treatment 400 comprises gas 402 and excited atoms 404. The gaseous soak treatment 400 may be performed in situ after the deposition of the first conductive layer 232. In an embodiment, gas 402 comprises $N_2$ and the excited atoms 404 comprise excited N atoms. In other embodiments, gas 402 may comprise $NH_3$ and the excited atoms 404 may comprise excited N atoms.

Figure 10B:
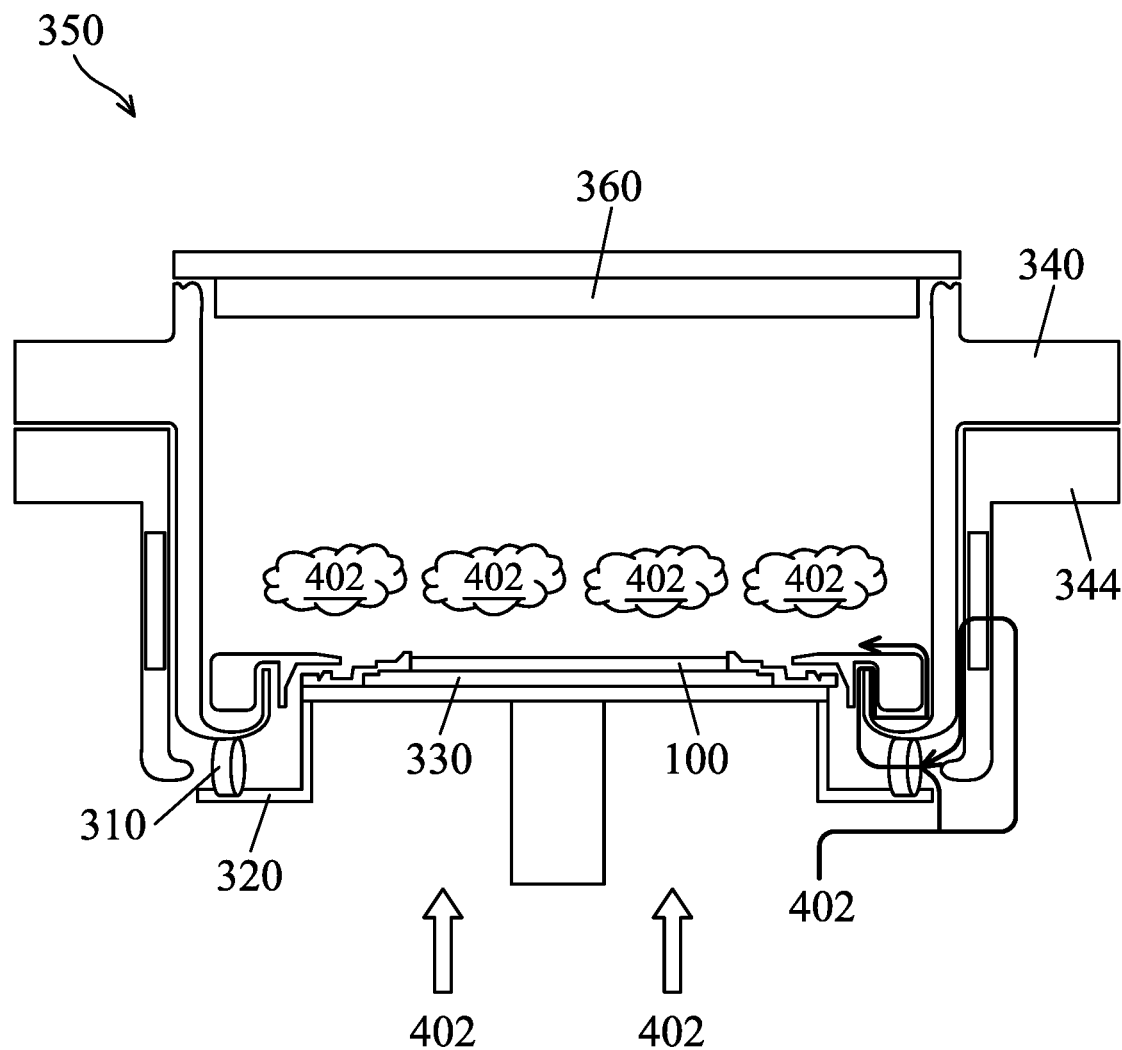

FIG. 10B illustrates an embodiment of the gaseous soak treatment 400 being performed in the treatment chamber 350. The semiconductor structure 100 is disposed on the electrostatic chuck 330 with the first conductive layer 232 exposed on its top surface. The gas 402 enters the treatment chamber 350 following the path indicated in FIG. 10B. The gas 402 may be supplied at a flow rate of between about 10 sccm to about 2000 sccm. The gaseous soak treatment 400 may be performed at a pressure in a range between about 10 mTorr to about 400 mTorr. The gaseous soak treatment 400 may be performed at a temperature between about 200° C. to about 600° C. It is advantageous for the flow rate to be at least about 10 sccm in order to form plasma, and it is advantageous for the flow rate to be about 2000 sccm or less because exceeding 2000 sccm may cause an arcing issue by overproduction of plasma. It is advantageous for the pressure to be at least about 10 mTorr because this pressure may allow the formation of sufficient plasma, and it is advantageous for the pressure to be about 400 mtorr or less because exceeding 400 mtorr may cause short mean free paths of the gas particles, reducing deposition rate and film quality. It is advantageous for the temperature to be at least about 200° C. in order to maintain plasma density, and it is advantageous for the temperature to be about 600° C. or less because higher temperatures may cause an arcing issue. During the gaseous soak treatment 400, a portion of the atoms from the gas 402 are excited by increasing temperature in the treatment chamber 350. The excited atoms 404 interact with the top surface of the first conductive layer 232.

Figure 10C:
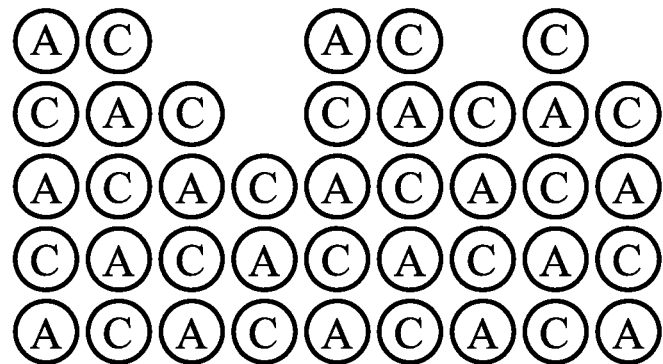
Figure 10D:
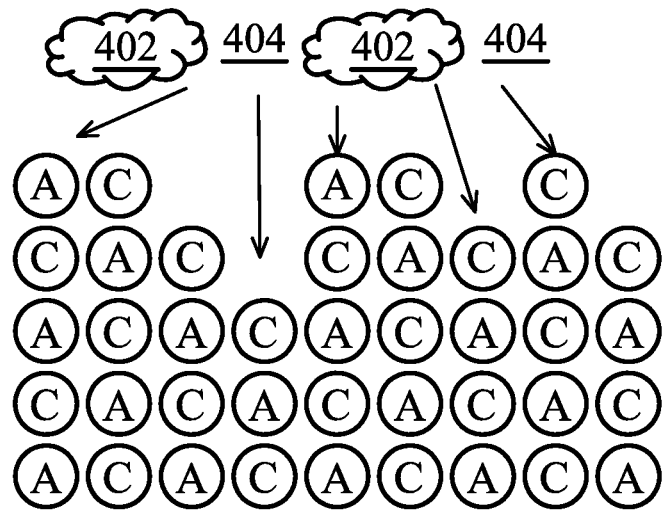
Figure 10E:
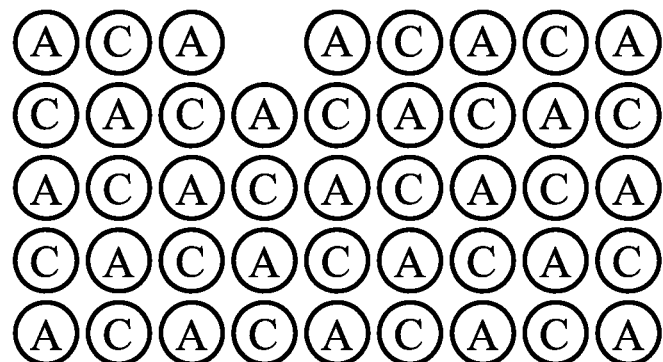

FIGS. 10C through 10E illustrate the operation of the gaseous soak treatment 400. FIG. 10C illustrates a cross section of a portion of the top surface of the first conductive layer 232, showing the ionic structure of cations C and anions A. In embodiments where the first conductive layer 232 consists substantially of TiN, the cations C are Ti atoms and the anions A are N atoms. In FIG. 10D, the gaseous soak treatment 400 is performed by exposing the first conductive layer 232 to the gas 402 and the excited atoms 404. FIG. 10E illustrates the result after the gaseous soak treatment 400 has been performed. Irregularities in the top surface of the first conductive layer 232 have been removed. The excited atoms 404 have filled gaps in the lattice structure of the top surface of the first conductive layer 232, resulting in an even distribution across the top surface of the first conductive layer 232. In embodiments where the first conductive layer 232 consists substantially of TiN and where the excited atoms 404 comprise excited N atoms, the excited N atoms 404 may fill gaps in the TiN lattice structure.

Figure 10F:
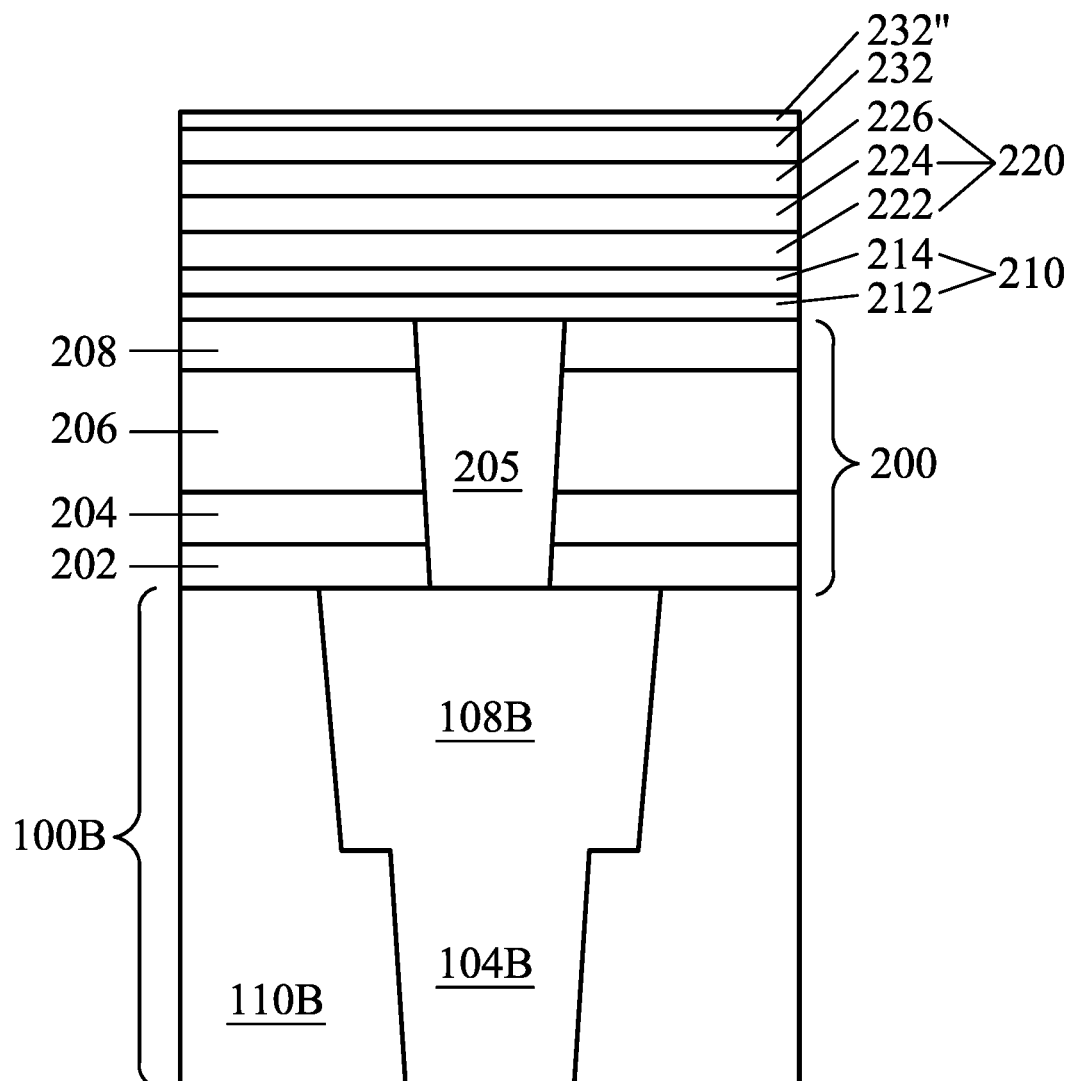

FIG. 10F illustrates the end result of applying the gaseous soak treatment 400. A smoothed conductive layer 232" has been formed on the first conductive layer 232. The spike points 231, as illustrated above in FIG. 10A, have been covered by the smooth conductive layer 232". The smoothed first conductive layer 232" may have a strongly defined crystallographic direction (200).

Figure 11A:
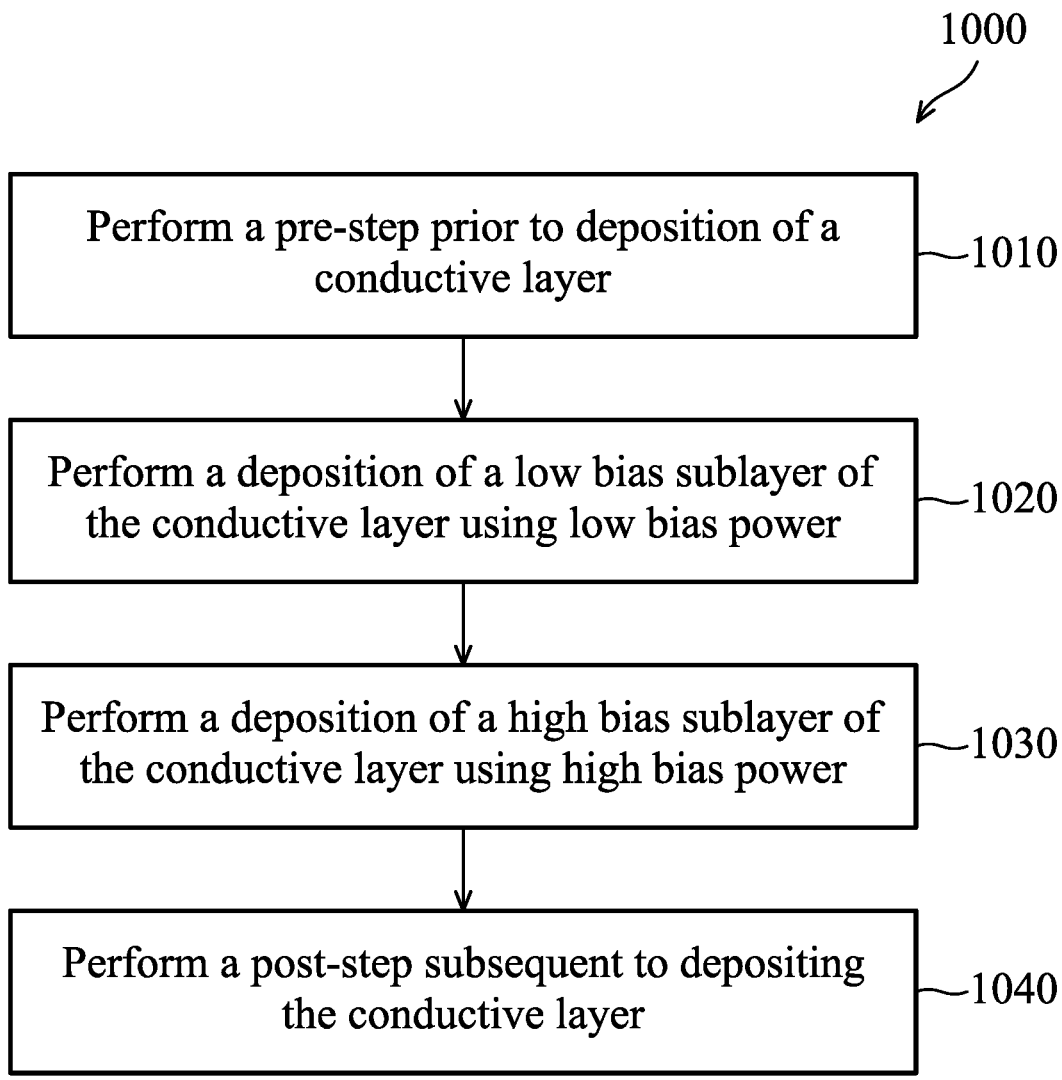
FIGS. 11A through 11E illustrate various embodiments of depositing conductive layers of a TE on an MTJ storage element, in accordance with some embodiments.

FIGS. 11A through 11E illustrate embodiments of methods for depositing multiple sublayers of the first conductive layer 232 using a process such as PVD with low and high bias power applied. The resulting mixed high/low bias films may have substantially flatter top surfaces devoid of sharp points. FIG. 11A illustrates an embodiment of a method 1000 in which a low bias sublayer 232a is formed with a lower bias power. The low bias sublayer 232a is then covered by a high bias sublayer 232b being formed with a higher bias power.

In more detail, a pre-deposition process, or pre-step, may be performed in step 1010 to prepare the top surface of the MTJ for deposition while de-gassing the treatment chamber 350. No deposition is performed during the pre-step. The pre-step may be performed for between about 10 seconds and about 100 seconds at a temperature of between about 300° C. and about 400° C.

Next, FIG. 11A further illustrates the formation of the low bias sublayer 232a in step 1020. In some embodiments, the low bias sublayer 232a comprises TiN. The low bias sublayer 232a may be formed at a temperature of between about 300° C. and about 400° C., in a chamber pressure of between about 10 mtorr to about 1000 mtorr, such as between about 100 mtorr to about 500 mtorr, and over a processing time between about 10 seconds and 1000 seconds. The low bias sublayer 232a may be formed using a DC plasma power (as measured at the power supply) between about 0 KW and about 30 KW, such as between about 0 KW and about 5 KW, and using a bias power between about 0 W and about 1000 W, such as between about 0 W and about 30 W. It is advantageous for the temperature to be at least about 300° C. in order to maintain plasma density, and it is advantageous for the temperature to be about 400° C. or less because temperature exceeding 400° C. may cause an arcing issue. It is advantageous for the chamber pressure to be at least about 10 mtorr in order to form the low bias sublayer 232a, and it is advantageous for the chamber pressure to be about 1000 mtorr or less because exceeding 1000 mtorr may cause short mean free paths of the plasma particles, reducing deposition rate and film quality. It is additionally advantageous for the chamber pressure to be in a range between about 100 mtorr to about 500 mtorr because controlling the chamber pressure in this range may achieve uniform film quality. It is advantageous for the processing time to be about 10 seconds or more in order to form the low bias sublayer 232a, and it is advantageous for the processing time to be about 1000 seconds or less because 1000 seconds may be sufficient to form the low bias sublayer 232a. It is advantageous for the DC plasma power to be about 30 KW or less in order to form plasma, and it is additionally advantageous for the DC plasma power to be about 5 KW or less in order to form the low bias sublayer 232a. It is advantageous for the bias power to be about 1000 W or less in order to form a high stress film, and it is additionally advantageous for the bias power to be about 30 W or less because higher AC power may cause an arcing issue. The low bias sublayer 232a may be formed to have a thickness between about 1 nm and 100 nm.

After the formation of the low bias sublayer 232a, FIG. 11A further illustrates the formation of the high bias sublayer 232b in step 1030. The high bias sublayer 232b may comprise TiN. The high bias sublayer 232b may be formed at a temperature of between about 300° C. and about 400° C., in a chamber pressure of between about 10 mtorr to about 1000 mtorr, such as between about 100 mtorr to about 500 mtorr, and over a processing time between about 10 seconds and 500 seconds. It is advantageous for the temperature to be at least about 300° C. in order to maintain plasma density, and it is advantageous for the temperature to be about 400° C. or less because exceeding 400° C. may cause an arcing issue. It is advantageous for the chamber pressure to be at least about 10 mtorr in order to form the high bias sublayer 232b, and it is advantageous for the chamber pressure to be about 1000 mtorr or less because exceeding 1000 mtorr may cause short mean free paths of the particles, reducing deposition rate and film quality. It is additionally advantageous for the chamber pressure to be between about 100 mtorr to about 500 mtorr because controlling the chamber pressure in this range may achieve uniform film quality. It is advantageous for the processing time to be between about 10 seconds and about 500 seconds in order to form the high bias sublayer 232b to a thickness of between about 10 nm and about 2000 nm.

The high bias sublayer 232b may be formed using a DC plasma power between about 0 KW and about 30 KW, such as between about 5 KW and about 20 KW, higher than the DC plasma power used to form the low bias sublayer 232a. The difference between the DC plasma powers used to form the low bias sublayer 232a and the high bias sublayer 232b may be between about 1000 W and about 5000 W. It is advantageous for the DC plasma power to be about 30 KW or less in order to form plasma, and it is additionally advantageous for the DC plasma power to be controlled between about 5 KW and about 20 KW in order to achieve the high bias sublayer 232b. The high bias sublayer 232b may be formed using a bias power between about 0 W and about 1000 W, such as between about 20 W and about 100 W, higher than the bias power used to form the low bias sublayer 232a. The difference between the bias powers used to form the low bias sublayer 232a and the high bias sublayer 232b may be between about 1000 W and about 5000 W. It is advantageous for the bias power to be about 1000 W or less because a higher bias power may form a compressive film, and it is additionally advantageous for the bias power to be between about 20 W and about 100 W in order to achieve a minimal stress film. The difference between the thicknesses of the low bias sublayer 232a and the high bias sublayer 232b may be between about 5 nm and about 2000 nm.

After the formation of the high bias sublayer 232b, FIG. 11A further illustrates in step 1040 that a post-deposition process, or post-step, may be performed. The post-step comprises de-gassing and cooling the treatment chamber 350 to prepare the top surface of the high bias sublayer 232b for the next step of the process. No deposition is performed during the post-step. The post-step may be performed for between about 1 second and 30 seconds at a temperature of between about 10° C. and about 100° C.

X-ray diffraction analysis of the first conductive layer 232 formed from the low bias sublayer 232a covered by the high bias sublayer 232b indicates intensity peaks at crystallographic directions (111) and (200). This may show that the embodiment illustrated in FIG. 11A of the formation of a low bias sublayer 232a and the subsequent formation of a high bias sublayer 232b produces a substantially flat first conductive layer 232 without significant spike points on its top surface. The prevention of the spike points may increase device performance.

Figure 11B:
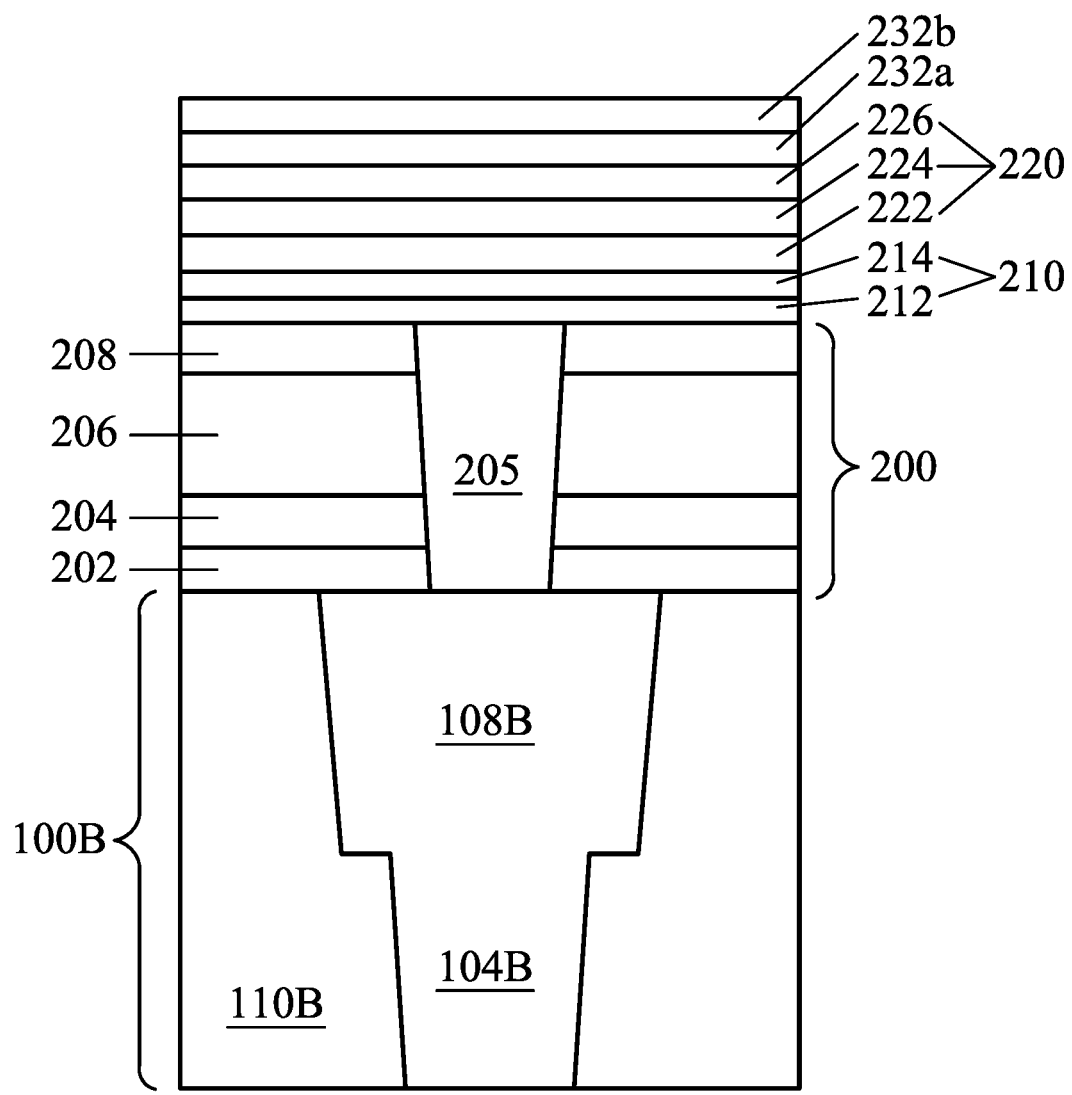

FIG. 11B illustrates the result of the method embodiment illustrated by FIG. 11A. As can be seen, the low bias sublayer 232a is disposed on the multilayered MJT layer 220. Additionally, by increasing the bias, the high bias sublayer 232b is formed and disposed on the low bias sublayer 232a.

Figure 11C:
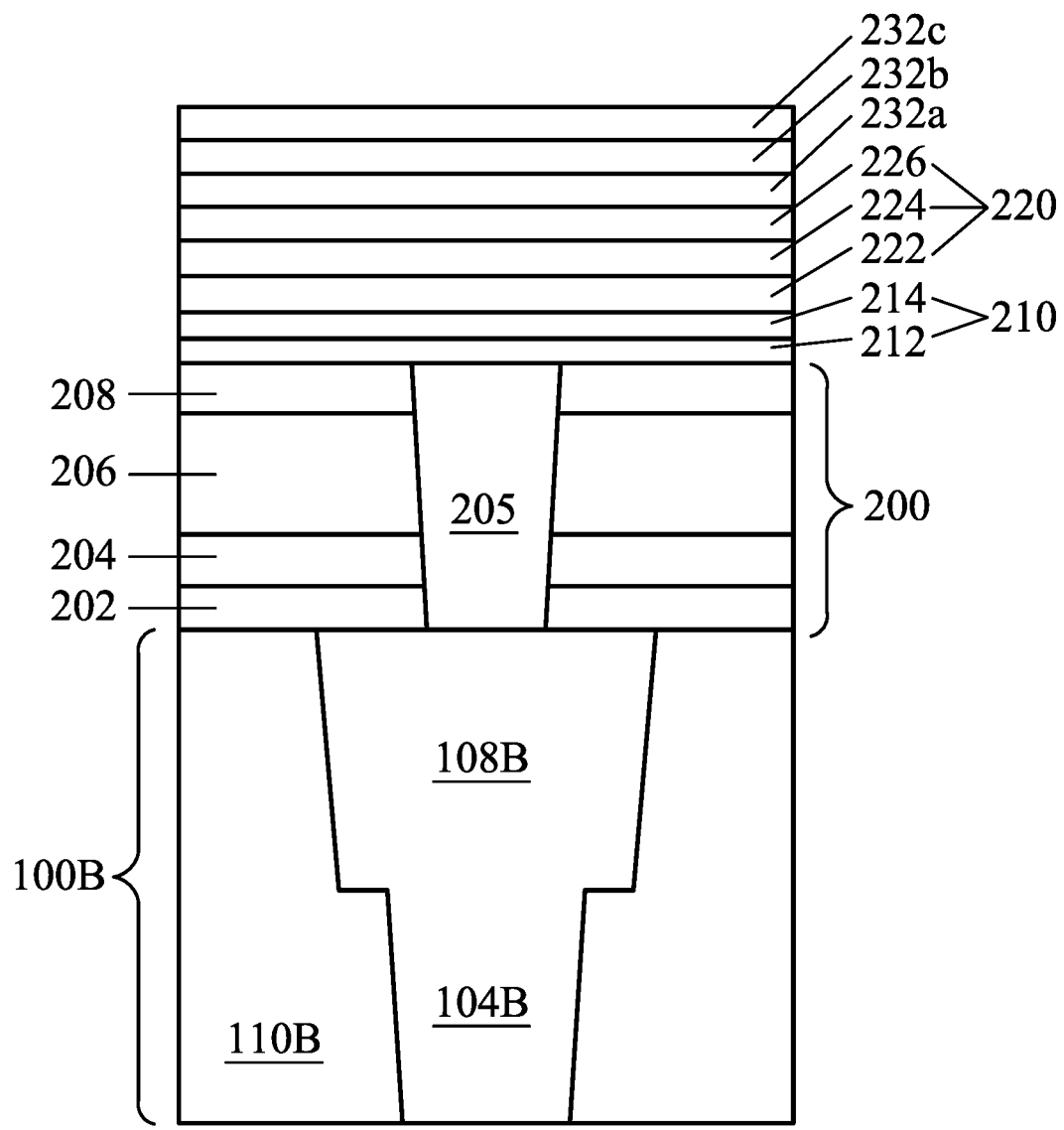

FIG. 11C illustrates the result of another embodiment which utilizes the low bias sublayer 232a and the high bias sublayer 232b, but which also utilizes a second high bias sublayer 232c over the high bias sublayer 232b. In an embodiment the second high bias sublayer 232c may be formed using the same parameters as the high bias sublayer 232b (and thereby simply increasing the thickness of the material of the high bias sublayer 232b), but in other embodiments the second high bias sublayer 232C may be formed by modifying the bias yet again to be either higher or lower than the bias utilized for the high bias sublayer 232b (while still being higher than the bias used to form the low bias sublayer 232a). As such, in one embodiment the second high bias sublayer 232C may be formed with a using a bias power between about 10 W and about 200 W, although any suitable bias may be utilized.

Figure 11D:
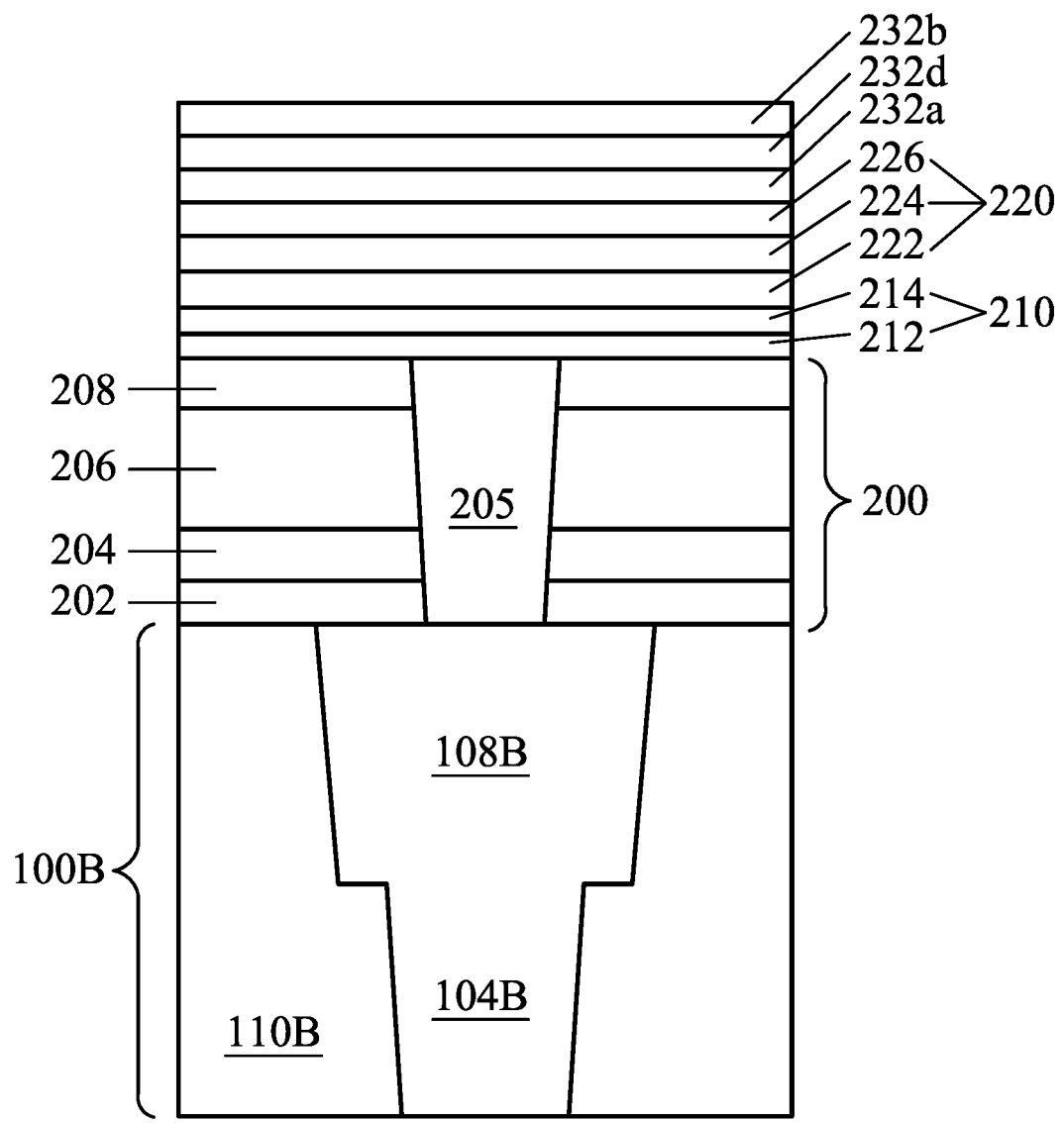

FIG. 11D illustrates the result of a different embodiment which utilizes the low bias sublayer 232a and the high bias sublayer 232b, but which also utilizes a second low bias sublayer 232d adjacent to the low bias sublayer 232a. In an embodiment the second low bias sublayer 232d may be formed using the same parameters as the low bias sublayer 232a (and thereby simply increasing the thickness of the material of the low bias sublayer 232a), but in other embodiments the second low bias sublayer 232d may be formed by modifying the bias yet again to be either higher or lower than the bias utilized for the low bias sublayer 232a (while still being lower than the bias used to form the high bias sublayer 232b). As such, in one embodiment the second low bias sublayer 232d may be formed with a using a bias power between about 10 W and about 200 W, although any suitable bias may be utilized.

Figure 11E:
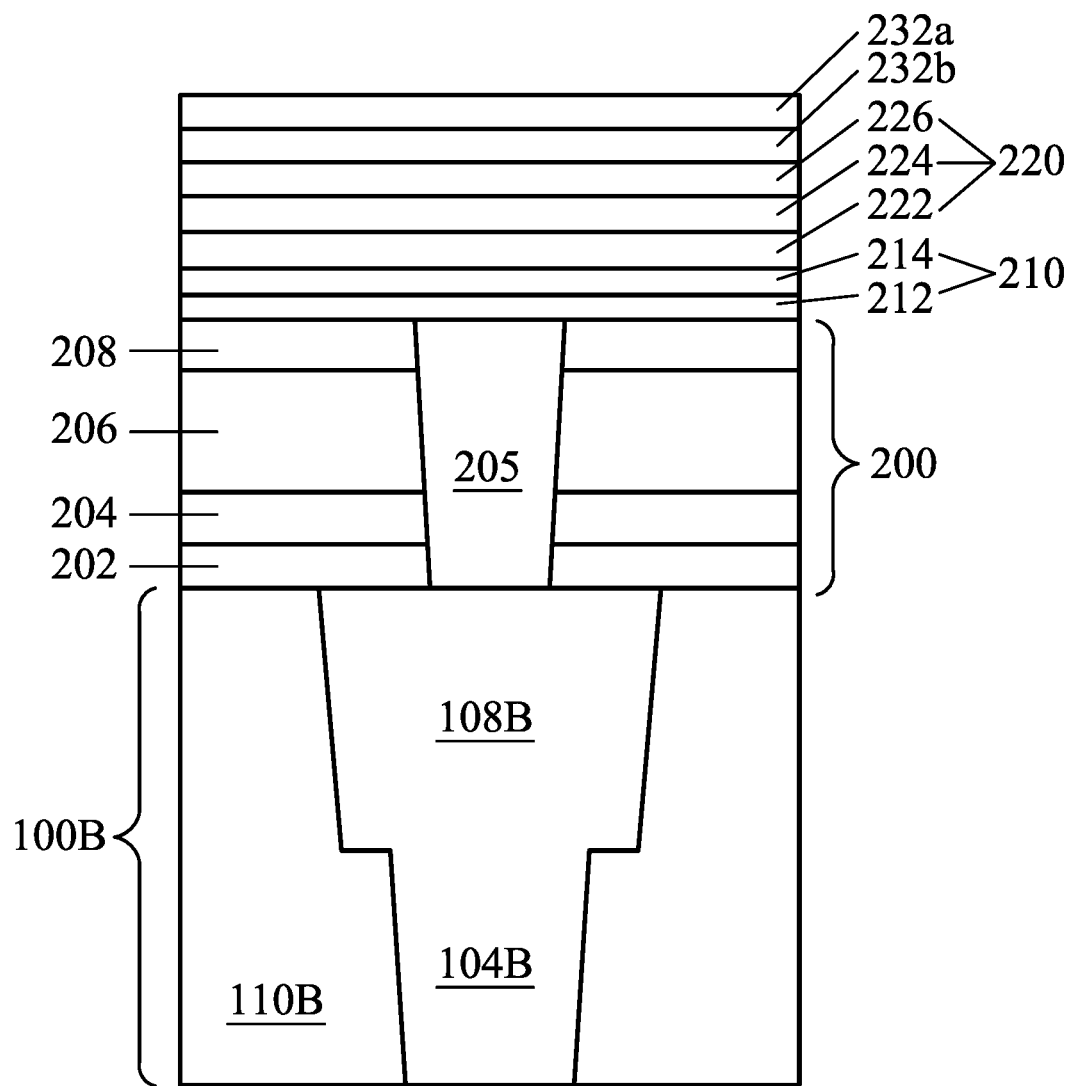
Figure 11F:
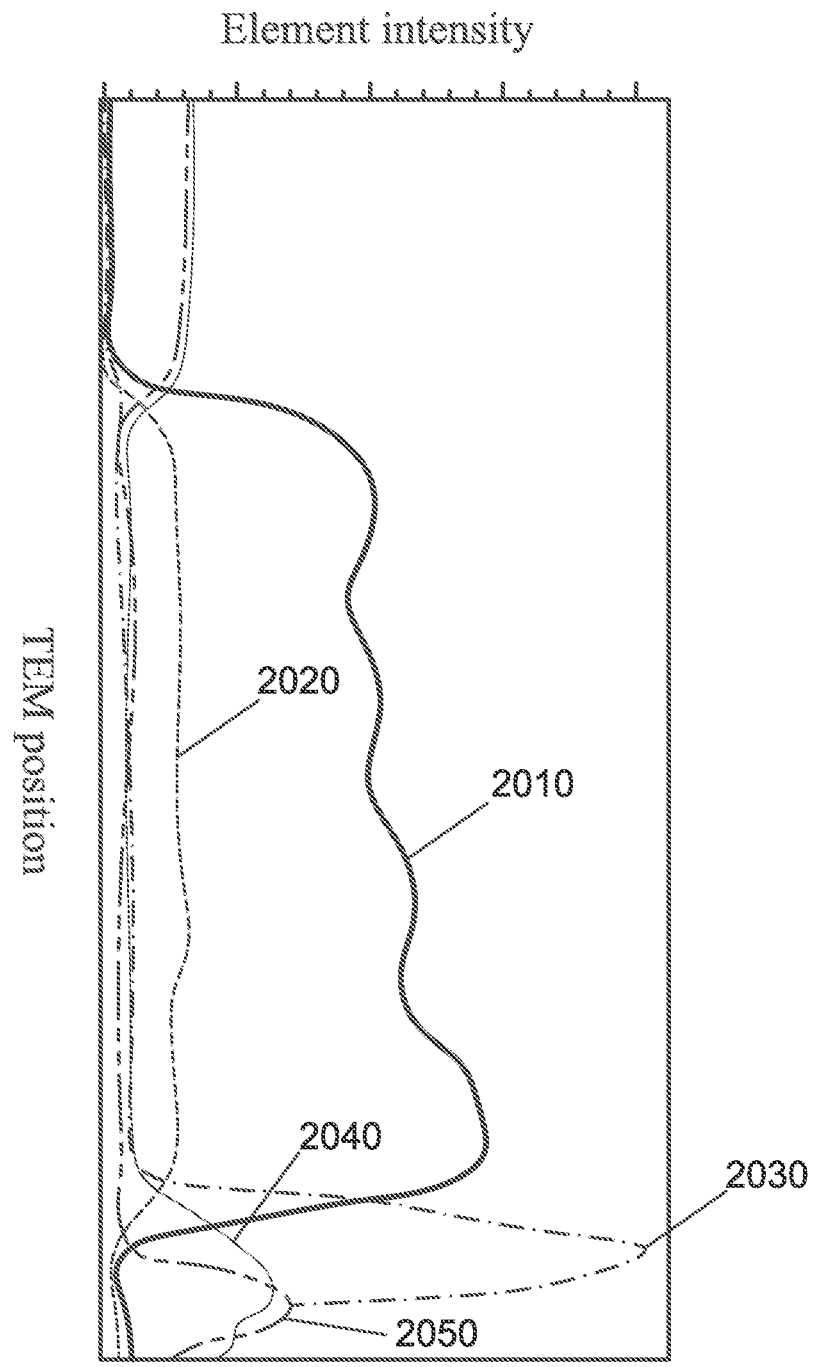
FIG. 11F illustrates a microscopic view of conductive layers of a TE on an MTJ storage element, in accordance with some embodiments.

FIG. 11E illustrates the result of yet another embodiment in which the low bias sublayer 232a and the high bias sublayer 232b are utilized. In this embodiment, however, the order of their formation is reversed so that the high bias sublayer 232b is formed first and then covered by forming the low bias sublayer 232a over it. As such, the high bias sublayer 232b is adjacent to and in direct contact with the MTJ layer 220.

Additionally, Applicant respectfully submits that the description of the embodiments described above for the use of the low bias sublayer 232a and the high bias sublayer 232b (along with the other layers described) is intended to be illustrative and is not intended to be limiting to the embodiments. Rather, any suitable combination of layers may be utilized. For example, in other embodiments, two low bias sublayers 232a may be formed without any high bias sublayers 232b being formed, or two high bias sublayers 232b may be formed without any low bias sublayers 232a being formed. In still other embodiments, different numbers, orders, and combinations of low bias sublayers 232a and high bias sublayers 232b may be formed. All such combinations are fully intended to be included within the scope of the embodiments.

In other embodiments, the formation of the low bias sublayer 232a and high bias sublayer 232b as illustrated in FIGS. 11A-B may be followed by the RF plasma treatment 300 illustrated in FIGS. 9A-F. In still other embodiments, the formation of the low bias sublayer 232a and the high bias sublayer 232b as illustrated in FIGS. 11A-B may be followed by the gaseous soak treatment 400 illustrated in FIGS. 10A-F. Performing the RF plasma treatment 300 or the gaseous soak treatment 400 on the low bias sublayer 232a and high bias sublayer 232b may further reduce or remove any spike points 231, increasing top surface flatness and improving device performance.

FIG. 1F shows a spectroscopic analysis of the elements of the first conductive layer 232 using the low bias sublayer 232a and the high bias sublayer 232b. In this chart, line 2010 represents titanium (Ti), line 2020 represents nitrogen (N), line 2030 represents gold (Au), line 2040 represents copper (Cu), and line 2050 represents tantalum (Ta). Lines 2010 and 2020, together indicating TiN, fall to zero right at the upper boundary of the top layer, indicating that no significant spike points of TiN exist above the upper boundary of the top layer.

Figure 12:
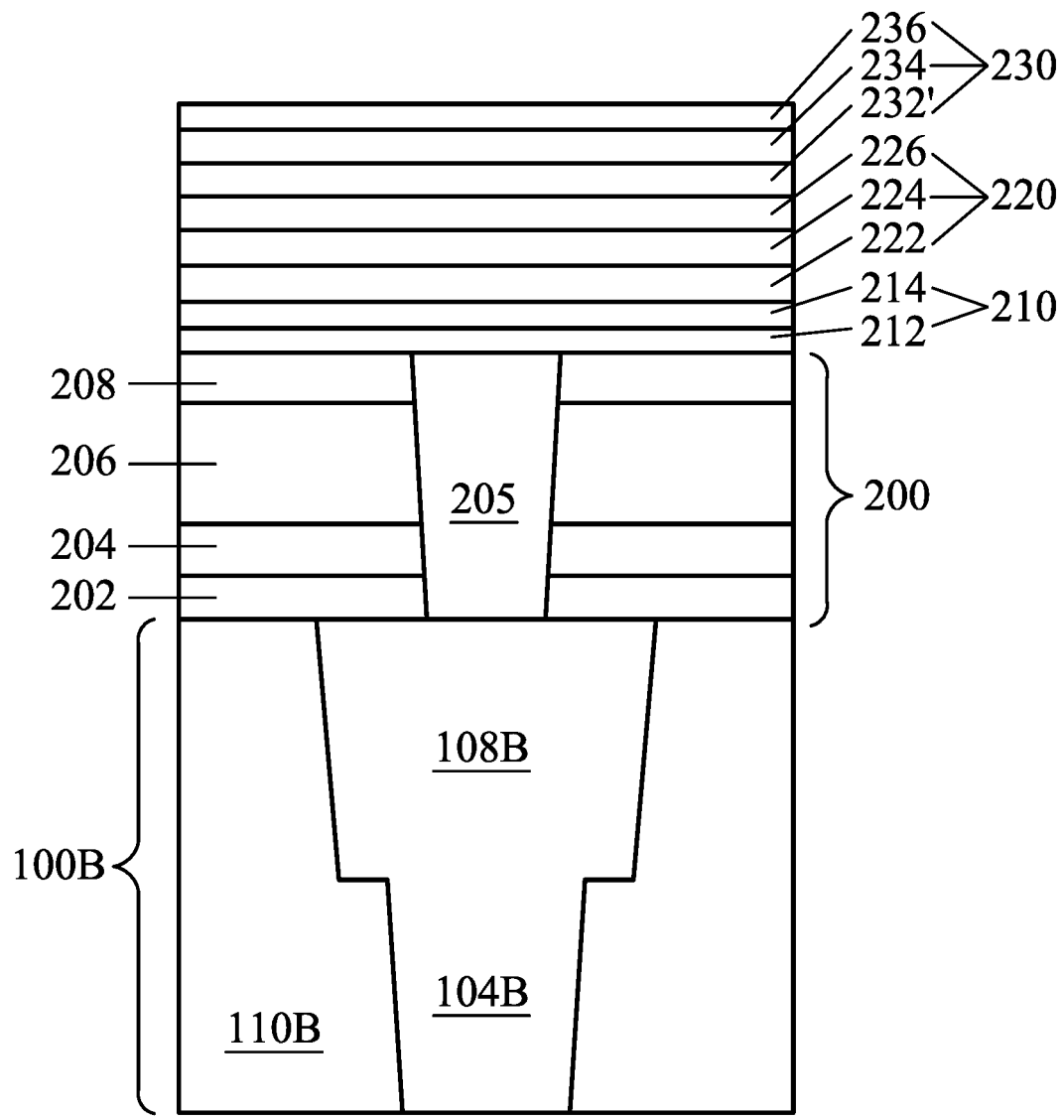
FIGS. 12 through 17 illustrate cross-sectional views of an MRAM cell using an MTJ storage element at various later stages of fabrication, in accordance with some embodiments.

FIG. 12 illustrates a top electrode (TE) layer 230 comprising several conductive layers formed over the MTJ layer 220. The example TE layer 230 in FIG. 12 comprises three conductive material layers: the first conductive layer 232' comprising TiN as formed in the embodiment illustrated in FIGS. 9A-F, a second conductive layer 234 comprising Ta, and a third conductive layer 236 comprising TaN formed sequentially, in accordance with some embodiments. In other embodiments, the TE layer 230 may comprise the first conductive layer 232" as formed in the embodiment illustrated in FIGS. 10A-F, or the TE layer 230 may comprise the low bias sublayer 232a and high bias sublayer 232b as illustrated in FIGS. 11A-D, or the TE layer 230 may comprise the low bias sublayer 232a and high bias sublayer 232b after the RF plasma treatment 300 or the gaseous soak treatment 400 is performed. In still other embodiments, the TE layer 230 may include a different number of conductive layers, and may use other conductive materials (e.g., Cu, Al, W, Ti, or the like). In these and other embodiments, the first conductive layer 232', 232", 232a and 232b, or the like is substantially devoid of spike point defects with widths around 100 nm. The conductive layers 234 and 236 may be deposited using any suitable technique, such as CVD, PECVD, ALD, PEALD, or PVD, or the like, or a combination thereof.

Figure 13:
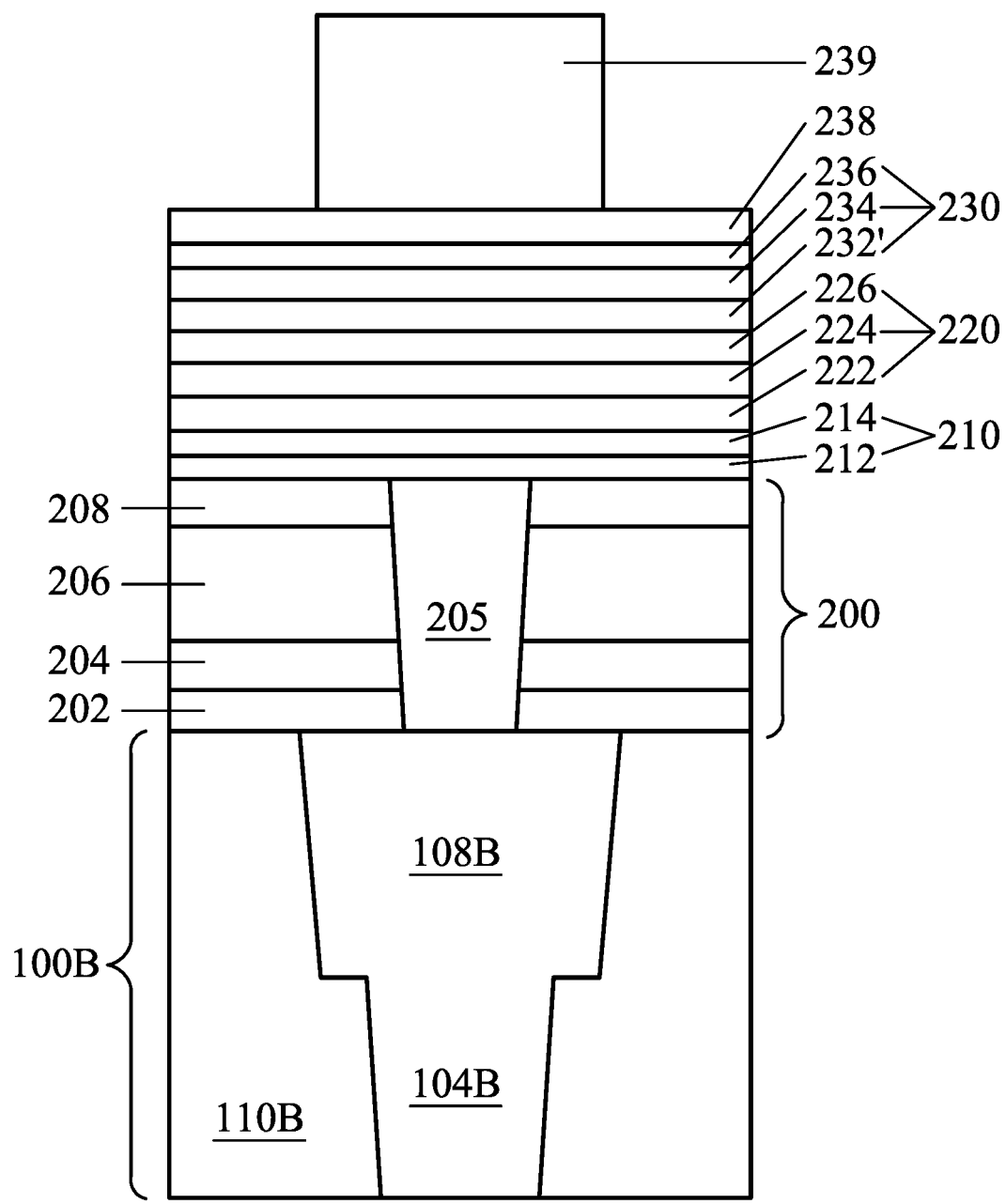

FIG. 13 illustrates a hard mask layer 238 deposited on top of the TE layer 230, and a photoresist layer 239 coated and patterned over the hard mask layer 238 using acceptable photolithography techniques. The hard mask layer 238 may comprise a dielectric material, in accordance with some embodiments. For example, the hard mask layer 238 may be silicon carbide (SiC), silicon oxynitride (SiON), silicon nitride (SiN), silicon dioxide ($SiO_2$), the like, and/or a combination thereof. The hard mask layer 238 may be deposited using any suitable technique, such as CVD, PECVD, ALD, PEALD, or PVD, the like, and/or a combination thereof.

Figure 14:
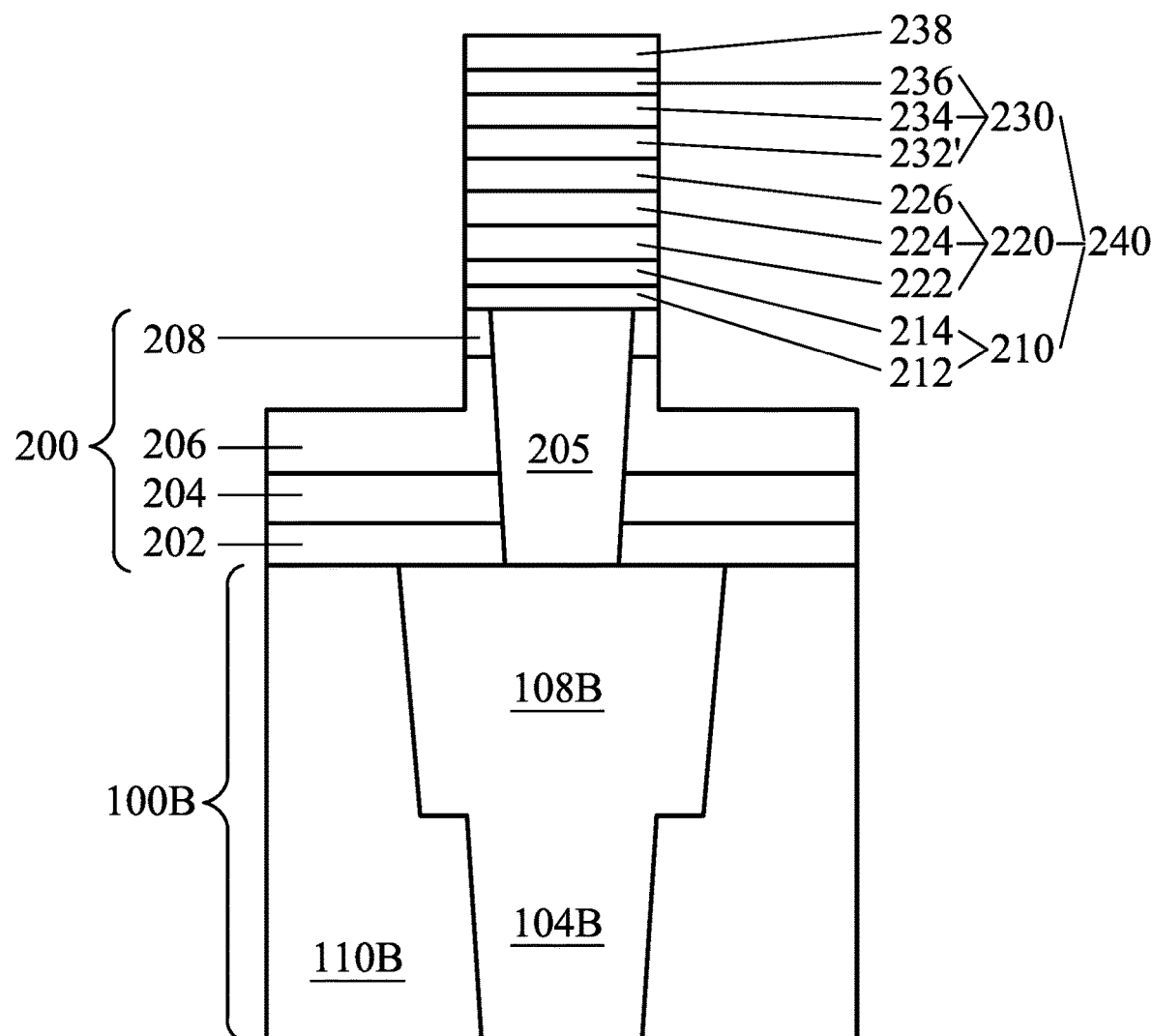

Referring now to FIG. 14, a suitable anisotropic etch (e.g., RIE) may be used to pattern the hard mask layer 238 using the patterned photoresist layer 239 (shown in FIG. 12) as an etch mask, and that pattern may be transferred to form the TE 230, the MTJ 220, and the BE 210 as illustrated in FIG. 14 using the patterned hard mask layer 238 as an etch mask. In addition, the etch process may remove the ARC 208 from the regions unprotected by the patterned hard mask layer 238 and recess the third dielectric layer 206 of the dielectric stack 200. Any remaining photoresist material may be removed by performing a surface clean process (e.g., an ashing process using oxygen plasma).

Figure 15:
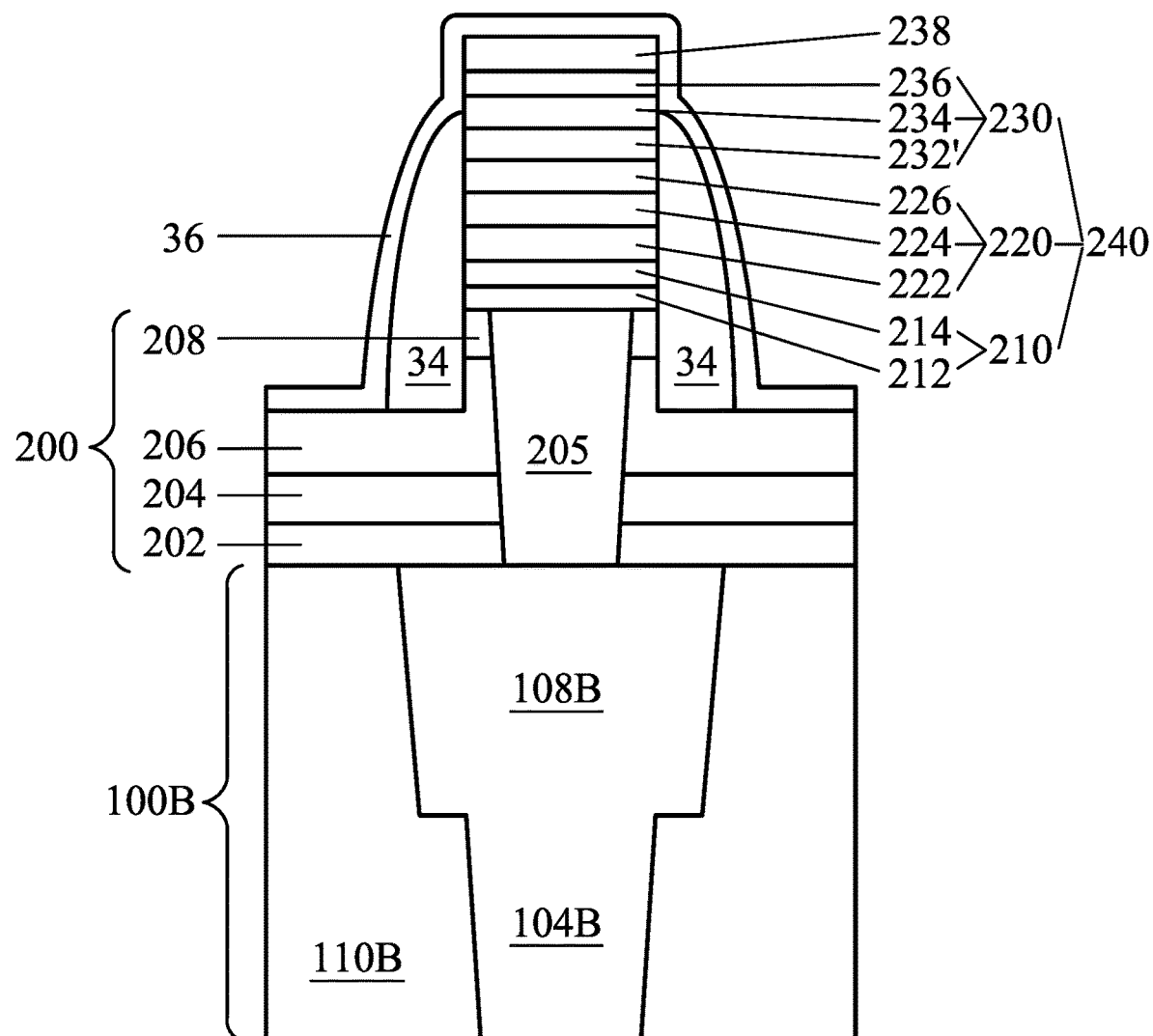

In FIG. 15, dielectric spacers 34 are shown on the vertical sidewalls of the structure illustrated in FIG. 8 supported from below by the recessed horizontal surface of the third dielectric layer 206 of the dielectric stack 200. The dielectric material used in dielectric spacers 34 may be silicon oxide, silicon nitride, or another suitable dielectric deposited by acceptable deposition techniques, such as CVD, PECVD, ALD, PEALD, PVD, the like, and/or a combination thereof, and etched by an appropriate anisotropic etching technique (e.g., RIE). In some embodiments, the etching process may form the dielectric spacers 34 recessed at the top thereby exposing the sides of the hard mask cover 238 and a portion of the TE 230. FIG. 15 also illustrates a protective dielectric cover layer 36 formed over the surface, in accordance with some embodiments. The protective dielectric cover layer 36 may be formed using dielectric materials similar to those used to form spacers 34. In some embodiments, the protective dielectric cover layer 36 may have a thickness from about 10 Å to about 3000 Å. The BE 210, the TE 230, and the MTJ 220 are collectively referred to as an MRAM cell 240.

Figure 16:
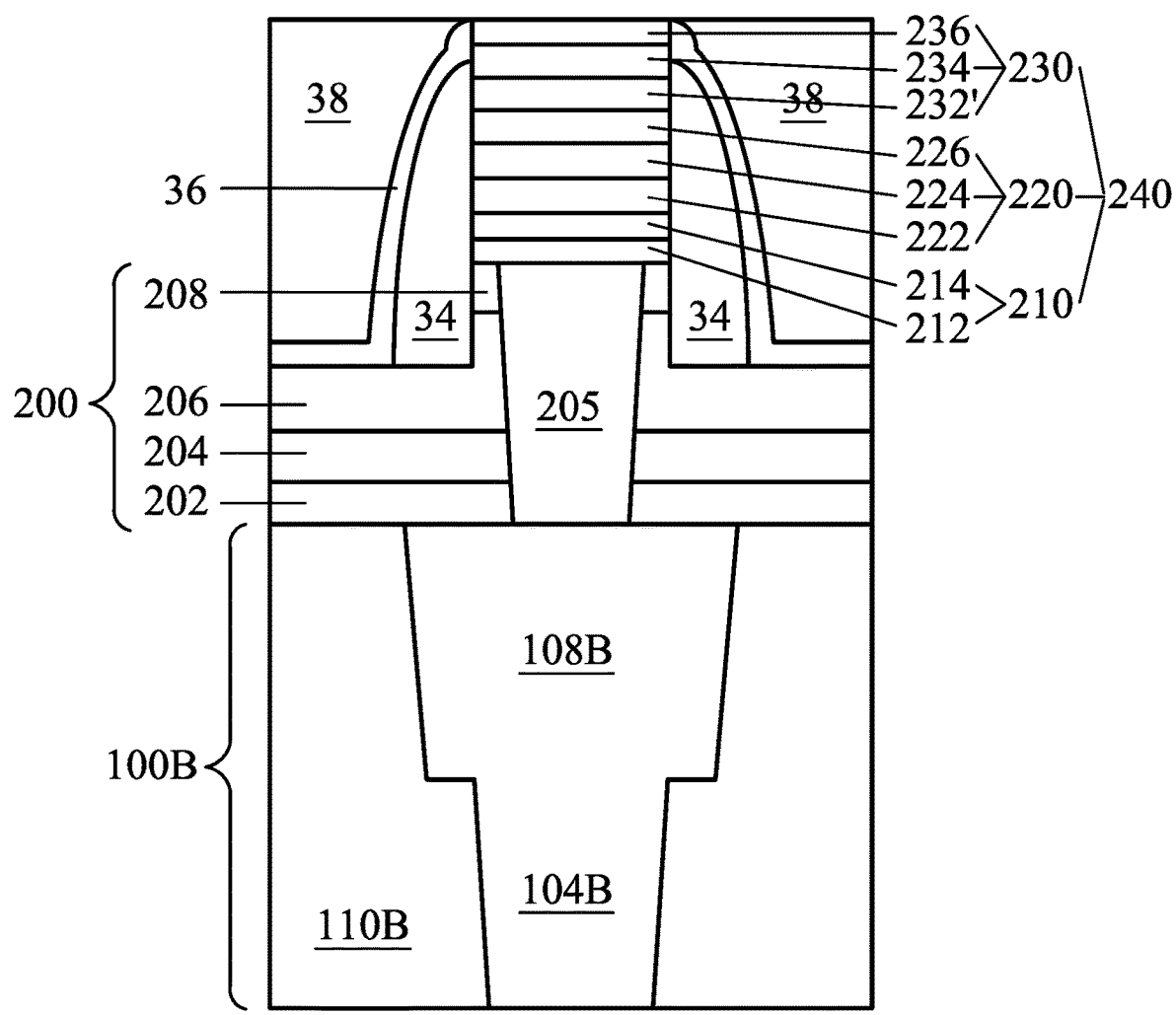

FIG. 16 illustrates a MRAM fill layer 38 formed adjacent to the MRAM cell 240 and filling the space in between memory cells. The MRAM fill layer 38 may be formed by depositing a dielectric material over the protective dielectric cover layer 36 and performing a suitable planarizing process (e.g., CMP) to remove excess materials. In some embodiments, the planarizing process removes all dielectric materials present over the TE 230, including a portion of protective dielectric cover layer 36 and the remaining the hard mask 238 covering the TE 230. The planarizing process may be completed once a top conductive surface of the topmost conductive layer 236 of TE 230 is exposed. As illustrated in FIG. 10, after the planarizing process, a top surface is formed having a dielectric portion substantially coplanar with a conductive portion. The MRAM fill layer 38 may use a suitable dielectric material, such as, $SiO_2$, SiON, PSG, BSG, BPSG, USG, or a low-k dielectric (e.g., PSG, BSG, BPSG, USG, FSG, SiOCH, CDO, flowable oxide, or porous oxides (e.g., xerogels/aerogels), or the like, or a combination thereof. The dielectric MRAM fill layer 38 may be formed using any suitable method, such as CVD, PVD, ALD, PECVD, HDP-CVD, SACVD, FCVD, spin-on, the like, and/or a combination thereof.

Figure 17:
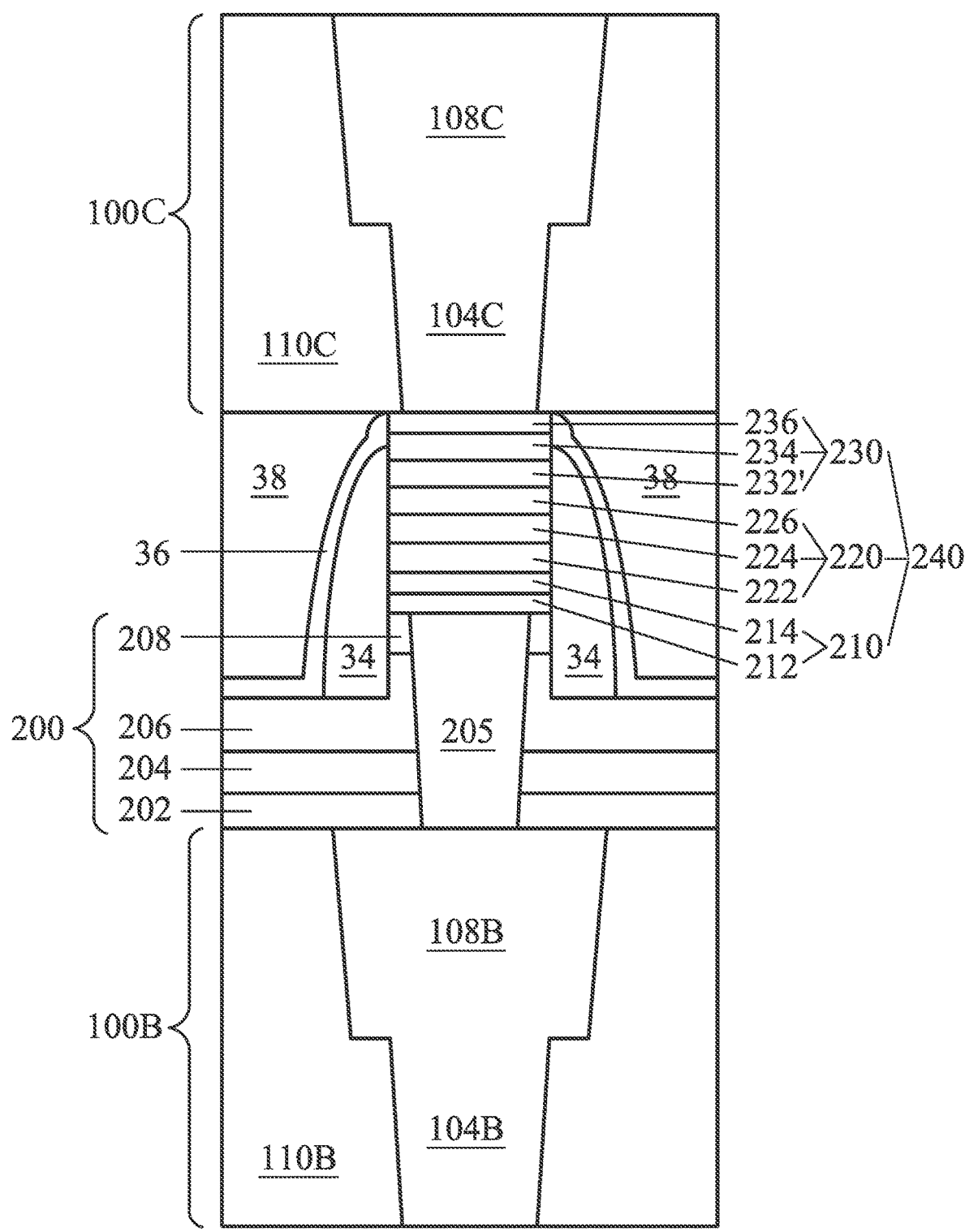

FIG. 17 illustrates a cross-sectional view of a third interconnect level positioned above the MRAM array. In FIG. 17, this level has been specified as the $3^{rd}$ interconnect level 100C. In this example, interconnect level 100C may be formed using the same materials and methods that were described to form the lower interconnect level 100B. The $3^{rd}$ interconnect level 100C is shown for illustrative purposes only; it is understood that different interconnect levels may be formed using the same materials and methods as the interconnect levels 100B and 100C. In FIG. 17, a via 104C and a line 108C are shown embedded in an insulating film IMD 110C. The via 104C may be used to make electrical connection to the top conductive surface of TE 230.

Digital data may be stored in an MTJ memory cell based on the magneto-resistive effect described below. In the embodiments described in this disclosure, the magnetic materials used to form the free layer 226 and the pinned layer 222 have a magnetic moment that may be polarized vertically. The MTJ is programmed electrically by forcing the direction of polarization to be either up or down by utilizing the spin torque transfer (ST) effect. During programming, the magnetic moment of the free layer 226 is adjusted to be either parallel or anti-parallel to the magnetic moment of the pinned layer 222 by appropriately biasing the top electrode 230 and the bottom electrode 210. The parallel configuration corresponds to a high probability for quantum mechanical tunneling of electrons through the tunnel barrier layer 224, while the anti-parallel configuration corresponds to a low tunneling probability. The information stored as the parallel or anti-parallel state is sensed during a read operation by sensing the magnitude of current flowing vertically through the tunnel barrier layer 224 when a cell is probed with a relatively small electrical voltage applied between the top electrode 230 and the bottom electrode 210. A response of a high electrical current (low resistance) indicates a parallel state while a low electrical current (high resistance) indicates an anti-parallel state.

The methods of forming and treating a top electrode (TE) of a magnetic tunnel junction (MTJ) memory cell described above are useful for improving device performance by preventing and/or removing sharp points, or spike point defects, on high thickness TE films, such as e.g. TiN films. Spike point defects may occur due to high grain size in the TE films produced by fabrication performed at high temperature with a long plasma deposition time. This high grain size may induce the formation of sharp points, or spike point defects, on the TE film. Sharp points can be prevented from being formed by deposition of the TE film in multiple steps using low bias and high bias power. Sharp points on the top surfaces of TE films can be removed by plasma treatments and soaking treatments.

In accordance with an embodiment, a method of forming a semiconductor structure includes: forming a first top electrode (TE) layer over a magnetic tunnel junction (MTJ) layer; performing a smoothing treatment on the first TE layer, wherein the smoothing treatment is performed in situ with the forming the first TE layer; and forming additional TE layers over the first TE layer. In an embodiment, the first TE layer includes TiN. In an embodiment, the first TE layer is formed to have a thickness between about 10 nm to about 200 nm. In an embodiment, forming the first TE layer is performed at a temperature between about 200° C. to about 400° C. In an embodiment, the performing the smoothing treatment includes an RF plasma treatment. In an embodiment, a gas for the RF plasma treatment is chosen from the group consisting of $N_2$, Ar, $H_2$, and $O_2$. In an embodiment, the RF plasma treatment is performed using an AC bias power between about 10 W to about 1000 W. In an embodiment, the RF plasma treatment includes flowing a gas at a rate between about 50 sccm to about 2000 sccm. In an embodiment, the performing the smoothing treatment includes a gaseous soaking treatment. In an embodiment, the gaseous soaking treatment includes flowing $N_2$ at a rate between about 10 sccm to about 2000 sccm. In an embodiment, the gaseous soaking treatment is performed at a temperature between about 200° C. to about 600° C. In an embodiment, the gaseous soaking treatment is performed at a pressure between about 10 mTorr to about 400 mTorr.

In accordance with another embodiment, a method of forming a magnetic random access memory (MRAM) cell includes: forming a bottom electrode via in a dielectric stack; forming a bottom electrode layer over the dielectric stack; forming a magnetic tunnel junction (MTJ) layer over the bottom electrode layer; forming a first top electrode (TE) layer over the MTJ layer, the forming the first TE layer including forming a first sublayer using a low bias power between about 0 W to about 30 W and forming a second sublayer using a high bias power between about 20 W to about 100 W; forming additional TE layers over the first TE layer; and after forming the TE layers, patterning the TE layers, the MTJ layer, and the bottom electrode layer to form a magnetic random access memory (MRAM) cell. In an embodiment, the first sublayer and the second sublayer are formed at a temperature between about 300° C. and about 400° C. and at a pressure between about 100 mtorr and about 500 mtorr. In an embodiment, the first sublayer is formed using a DC plasma power between about 0 KW and about 5 KW. In an embodiment, the second sublayer is formed using a DC plasma power between about 5 KW and about 20 KW. In an embodiment, the second sublayer is formed on the first sublayer. In an embodiment, the method further includes forming a plurality of first sublayers and/or a plurality of second sublayers.

In accordance with yet another embodiment, a semiconductor structure includes: a magnetic tunnel junction (MTJ) disposed on a bottom electrode, wherein the bottom electrode is disposed on a dielectric stack and a bottom electrode via; and a top electrode, including a first layer disposed on the top surface of the MTJ, the first layer including TiN, the first layer having an order of diffraction greater than 1.4, and a second layer disposed on the first layer, the second layer including Ta. In an embodiment, the first layer has a thickness between about 10 nm to about 200 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a magnetic random access memory (MRAM) cell, the method comprising:
    forming a bottom electrode layer;
    forming a magnetic tunnel junction (MTJ) layer over the bottom electrode layer;
    forming a first top electrode (TE) layer over the MTJ layer, the forming the first TE layer comprising:
        forming a first sublayer of a first metal using a first bias power; and
        forming a second sublayer of the first metal using a second bias power, wherein the second bias power is greater than the first bias power;
    forming one or more additional TE layers over the first TE layer; and
    after forming the TE layers, patterning the TE layers, the MTJ layer, and the bottom electrode layer to form a magnetic random access memory (MRAM) cell.

2. The method of claim 1, wherein the first bias power is in a range from 0 W to 30 W.

3. The method if claim 1, wherein the second bias power is in a range from 20 W to 100 W.

4. The method of claim 1, wherein the forming the first sublayer and the forming the second sublayer are performed at least in part at a temperature between about 300° C. and about 400° C. and at a pressure between about 100 mtorr and about 500 mtorr.

5. The method of claim 1, wherein the forming the first sublayer is performed at least in part using a DC plasma power between about 0 KW and about 5 KW.

6. The method of claim 1, wherein the forming the second sublayer is performed at least in part using a DC plasma power between about 5 KW and about 20 KW.

7. The method of claim 1, wherein the forming the second sublayer forms the second sublayer on the first sublayer.

8. The method of claim 1, further comprising performing a smoothing treatment on the first TE layer, wherein the smoothing treatment is performed in situ with the forming the first TE layer, the smoothing treatment being performed at a temperature in a range of 200° C. to 600° C.

9. A method of forming a semiconductor structure, the method comprising;
    forming a magnetic tunnel junction (MTJ) layer over a bottom electrode;
    forming a top electrode over the MTJ layer, wherein the forming the top electrode comprises:
        forming a first conductive layer with a first conductive material, wherein the first conductive layer is in physical contact with the MTJ layer and is free of spike points;
        forming a second conductive layer with a second conductive material different from the first conductive material, wherein the second conductive layer is in physical contact with the first conductive layer; and
        forming a third conductive layer with a third conductive material different from both the first conductive material and the second conductive material, wherein the third conductive layer is in physical contact with the second conductive layer; and
    surrounding the top electrode with a dielectric material in direct physical contact with sidewalls of the first conductive layer, the second conductive layer, and the third conductive layer.

10. The method of claim 9, wherein the first conductive material comprises titanium nitride.

11. The method of claim 9, wherein the second conductive material comprises tantalum.

12. The method of claim 9, wherein the third conductive material comprises tantalum nitride.

13. The method of claim 9, wherein the forming the MTJ layer comprises:
    forming a pinning layer over the bottom electrode;
    forming a tunnel barrier layer over the pinning layer; and
    a free layer over the tunnel barrier layer.

14. The method of claim 9, wherein the first conductive layer has a thickness in a range of 10 nm to 200 nm.

15. A method of forming a semiconductor device, the method comprising:
    forming a first conductive layer in physical contact with a top surface of a magnetic tunnel junction (MTJ) layer, wherein the first conductive layer comprises titanium nitride, and wherein the first conductive layer is free of spike points;
    forming a second conductive layer in physical contact with a top surface of the first conductive layer, wherein the second conductive layer comprises tantalum; and
    forming a third conductive layer in physical contact with a top surface of the second conductive layer, wherein the third conductive layer comprises tantalum nitride, wherein after the forming the third conductive layer sidewalls of the first conductive layer, the second conductive layer, and the third conductive layer are all in physical contact with a dielectric material.

16. The method of claim 15, wherein the forming the first conductive layer comprises performing a smoothing treatment on the first conductive layer, wherein the smoothing treatment is performed in situ with the forming the first conductive layer.

17. The method of claim 16, wherein the smoothing treatment is performed at a temperature in a range of 200° C. to 600° C.

18. The method of claim 16, wherein the smoothing treatment comprises an RF plasma treatment.

19. The method of claim 18, wherein the RF plasma treatment utilizes an AC bias power in a range of 10 W to 1000 W.

20. The method of claim 16, wherein the smoothing treatment comprises a gaseous soaking treatment.

* * * * *